United States Patent
Yokoyama

[11] Patent Number: 6,022,780
[45] Date of Patent: Feb. 8, 2000

[54] SEMICONDUCTOR DEVICE HAVING SOURCE AND DRAIN REGIONS DIFFERENT IN DEPTH FROM EACH OTHER AND PROCESS OF FABRICATION THEREOF

[75] Inventor: Hiroaki Yokoyama, Tokyo, Japan

[73] Assignee: NEC Corporation, Tokyo, Japan

[21] Appl. No.: 09/133,599

[22] Filed: Aug. 13, 1998

Related U.S. Application Data

[62] Division of application No. 08/986,748, Dec. 8, 1997.

[30] Foreign Application Priority Data

Dec. 6, 1996  [JP]  Japan ................... 8-326831

[51] Int. Cl.$^7$ ................................. H01L 21/265
[52] U.S. Cl. .................... 438/286; 438/305; 438/529
[58] Field of Search .................... 438/286, 229, 438/230, 231, 232, 301, 303, 305, 306, 307, 529

[56] References Cited

U.S. PATENT DOCUMENTS 5,648,286  7/1997  Gardner et al. ................. 437/44

FOREIGN PATENT DOCUMENTS

| 50-18176 | 2/1975 | Japan . |
| 50-156377 | 12/1975 | Japan . |
| 55-44748 | 3/1980 | Japan . |
| 57-148374 | 9/1982 | Japan . |
| 62-176166 | 8/1987 | Japan . |
| 62-213163 | 9/1987 | Japan . |

*Primary Examiner*—Donald L. Monin, Jr.
*Assistant Examiner*—Hoai Pham
*Attorney, Agent, or Firm*—Sughrue, Mion, Zinn Macpeak & Seas, PLLC

[57] ABSTRACT

A side wall spacer and a spacer layer are concurrently formed from an insulating layer in such a manner that the side wall spacer is on one side surface of a gate electrode and the spacer layer covers a drain forming area and the other side surface of the gate electrode, and n-type dopant impurity is ion implanted into the drain forming area and a source forming area, thereby concurrently forming a shallow drain region and a deep source region on both sides of the gate electrode.

13 Claims, 19 Drawing Sheets

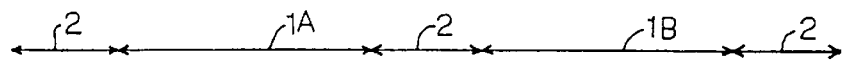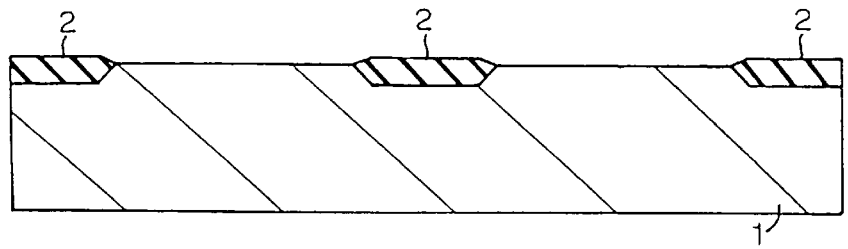
Fig. 1A
PRIOR ART
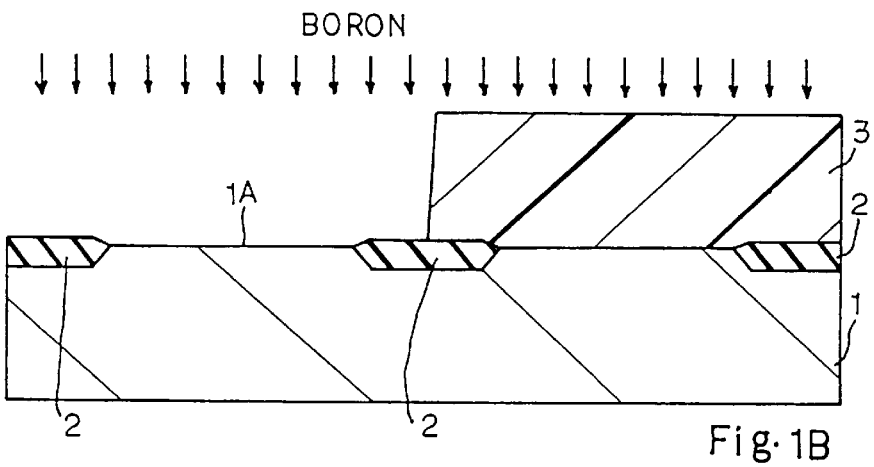
Fig. 1B
PRIOR ART
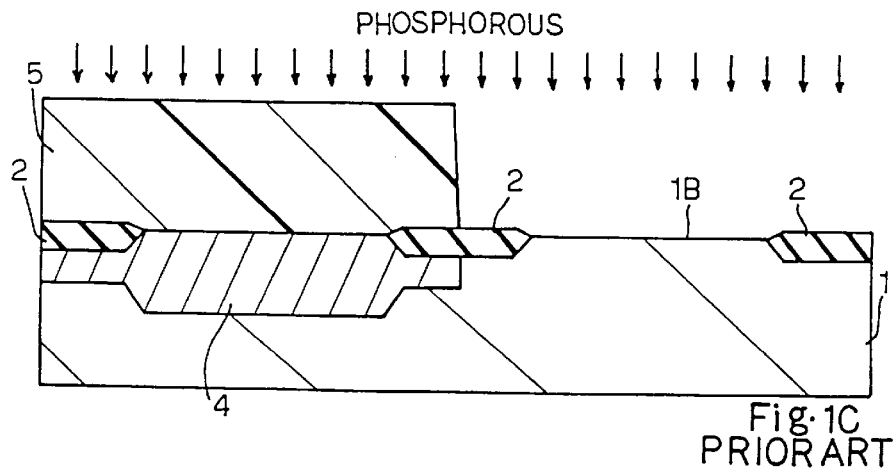
Fig. 1C
PRIOR ART

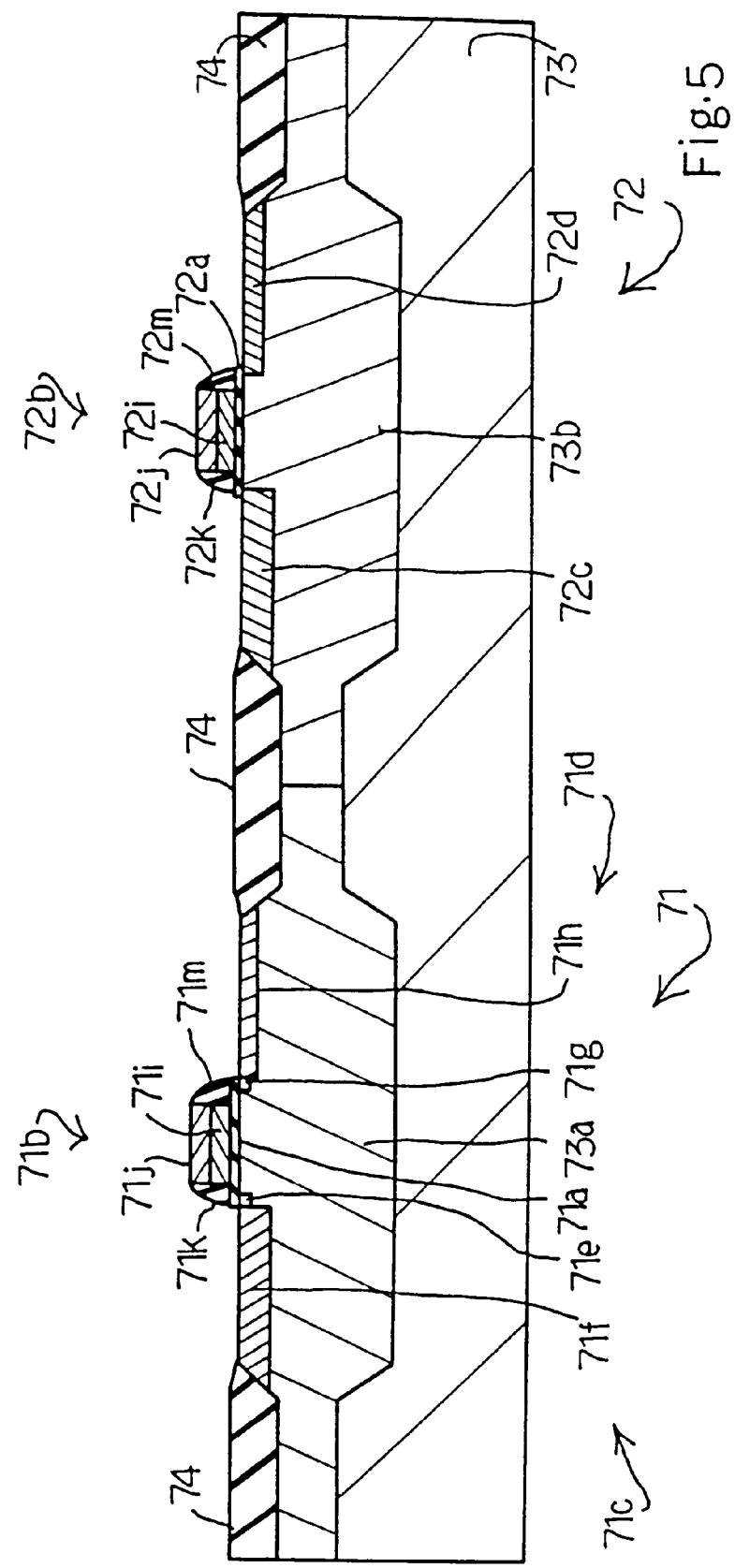

SEMICONDUCTOR DEVICE HAVING SOURCE AND DRAIN REGIONS DIFFERENT IN DEPTH FROM EACH OTHER AND PROCESS OF FABRICATION THEREOF

This is a divisional of application Ser. No. 08/986,748 filed Dec. 8, 1997, the disclosure of which is incorporated herein by reference.

FIELD OF THE INVENTION

This invention relates to a semiconductor device and, more particularly, to a semiconductor device having source and drain regions different in depth from each other and a process of fabrication thereof.

DESCRIPTION OF THE RELATED ART

A semiconductor integrated circuit device has been increased in integration density, and the higher integration density is achieved by miniaturizing circuit components. A field effect transistor is an important circuit components of the integrated circuit, and has been also miniaturized. However, when the field effect transistor is miniaturized, the channel length is decreased, and punch-through phenomenon tends to take place between the drain region and the source region. In order to prevent the field effect transistor from the punch-through phenomenon, the source and drain regions are formed into an LDD (Lightly Doped Drain) structure.

FIGS. 1A to 1J illustrate essential steps of the prior art process for fabricating a field effect transistor with the LDD structure, and the process sequence shown in FIGS. 1A to 1J is hereinbelow referred to as "first prior art process". The process starts with preparation of a preparation of a silicon substrate 1. A thick field oxide layer 2 is selectively grown to 400 nanometers thick in the surface portion of the silicon substrate 1 by using a LOCOS (localized oxidation of silicon) technique. The thick field oxide layer 2 defines active areas 1A and 1B as shown in FIG. 1A, and the active areas 1A and 1B are respectively assigned to an n-channel enhancement type field effect transistor and a p-channel enhancement type field effect transistor.

Subsequently, photo-resist solution is spun onto the major surface of the silicon substrate 1, and is baked so as to form a photo-resist layer. A pattern image is optically transferred from a reticle (not shown) to the photo-resist layer, and a latent image is formed in the photo-resist layer. The latent image is developed, and a photo-resist ion-implantation mask 3 is formed from the photo-resist layer. Thus, the photo-resist ion-implantation mask 3 is patterned through photo-lithographic techniques. The photo-resist ion-implantation mask 3 covers the active area 1B assigned to the p-channel enhancement type field effect transistor. Boron is ion implanted into the active area 1A at dose of $1\times10^{13}$ to $2\times10^{13}$ cm$^{-2}$ under acceleration energy of 300 KeV as shown in FIG. 1B, and the ion-implanted boron forms a p-type well 4 in the active area 1A. A channel doping is further carried out for the n-channel enhancement type field effect transistor.

The photo-resist ion-implantation mask 3 is stripped off, and another photo-resist ion-implantation mask 5 is formed on the silicon substrate 1 by using the photo-lithographic techniques. The photo-resist ion-implantation mask 5 covers the active area 1A, and exposes the active area 1B. Using the photo-resist ion-implantation mask 5, phosphorous is ion implanted into the active area 1B at dose of $1\times10^{13}$ to $2\times10^{13}$ cm$^{-2}$ under acceleration energy of 700 KeV as shown in FIG. 1C. A channel doping is also carried out for the p-channel enhancement type field effect transistor. The ion-implanted phosphorous forms an n-type well 6 in the active area 1B, and the photo-resist ion-implantation mask 5 is stripped off. The resultant semiconductor structure is shown in FIG. 1D.

Subsequently, the active areas 1A/1B are thermally oxidized so as to form silicon oxide layers 7a/7b of 8 nanometers thick. Polysilicon is deposited to 100 nanometers thick over the entire surface of the resultant semiconductor structure by using a chemical vapor deposition, and, thereafter, refractory metal silicide such as titanium silicide or tungsten silicide is deposited to 100 nanometers thick over the polysilicon layer by using a sputtering. Thus, the polysilicon layer and the refractory metal silicide layer are laminated over the resultant semiconductor structure.

A photo-resist etching mask (not shown) is formed on the refractory metal silicide layer by using the photo-lithographic techniques, and covers predetermined areas of the refractory metal silicide layer for gate electrodes. Using the photo-resist etching mask, the refractory metal suicide layer and the polysilicon are selectively etched away, and gate electrodes 8 and 9 are patterned on the silicon oxide layers 7a/7b, respectively, as shown in FIG. 1E. The gate electrodes 8/9 have a polyside structure, and consist of polysilicon strips 8a/9a and refractory metal silicide strips 8b/9b.

Subsequently, a photo-resist ion-implantation mask 11 is formed on the resultant semiconductor structure by using the photo-lithographic techniques, and covers the n-type well 6. Phosphorous is ion implanted into the p-type well 4 at dose of $1\times10^{13}$ to $2\times10^{13}$ cm$^{-2}$ under acceleration energy of 15 to 25 KeV as shown in FIG. 1F, and forms lightly doped n-type source/drain regions 11a/12a in a self-aligned manner with the gate electrode 8. The photo-resist ion-implantation mask 10 is stripped off.

Silicon oxide is deposited to 150 nanometers thick over the entire surface of the resultant semiconductor structure by using a chemical vapor deposition, and the thick field oxide layer 2, the silicon oxide layers 7a/7b and the gate electrodes 8/9 are covered with a silicon oxide layer 13 as shown in FIG. 1G.

The silicon oxide layer 13 is uniformly etched away without an etching mask until the lightly-doped n-type source/drain regions 11a/12a and the n-type well 6 are exposed again. The silicon oxide layers 7a/7b are patterned into gate insulating layers 14/15, and the silicon oxide layer 13 are formed into side wall spacers 13a/13b.

A photo-resist ion-implantation mask 16 is formed on the resultant semiconductor structure by using the photo-lithographic techniques, and covers then-type well 6 and the gate electrode 9 with the side wall spacers 13b. Arsenic is ion implanted into the p-type well 4 at dose of $3\times10^{15}$ to $5\times10^{15}$ cm$^{-2}$ under acceleration energy of 30 to 40 KeV as shown in FIG. 1H, and the ion-implanted arsenic forms heavily doped n-type source/drain regions 11b/12b in a self-aligned manner with the side wall spacers 13a. The photo-resist ion-implanted mask 16 is stripped off. The gate insulating layer 14, the gate electrode 8, the side wall spacers 13a, the lightly-doped n-type source/drain regions 11a/12a and the heavily-doped n-type source/drain regions 11b/12b as a whole constitute an n-channel enhancement type field effect transistor 17.

A photo-resist ion-implantation mask 18 is formed on the resultant semiconductor structure by using the photo-lithographic techniques, and covers the n-channel enhancement type field effect transistor 17. Boron difluoride ($BF_2$) is ion-implanted into the n-type well 6 at dose of $1\times10^{15}$ to $2\times10^{15}$ cm$^{-2}$ under acceleration energy of 30 to 50 KeV as shown in FIG. 1I, and the ion-implanted boron difluoride forms heavily doped p-type source/drain regions 19/20 in a self-aligned manner with the side wall spacer 13b as shown in FIG. 1J. The gate insulating layer 15, the gate electrode 9, the side wall spacers 13b and the heavily-doped p-type source/drain regions 19/20 as a whole constitute a p-channel enhancement type field effect transistor 21 as shown in FIG. 1J.

The lightly-doped n-type source/drain regions 11a and 12a are concurrently formed, and the heavily-doped n-type source/drain regions 11b and 12b are also concurrently formed. For this reason, the lightly-doped n-type source region 11a and the heavily-doped n-type source region 11b are equal in depth to the lightly-doped n-type drain region 12a and the heavily-doped n-type drain region 12b, respectively. Similarly, the heavily-doped p-type source/drain regions 19 and 20 are concurrently formed, and the heavily-doped p-type source region 19 is equal in depth to the heavily-doped p-type drain region 20.

When the field effect transistors 17/21 are further scaled down, the heavily-doped n-type source/drain regions 11b/12b and the heavily-doped p-type source/drain regions 19/20 become shallower, and the heavily-doped n-type shallow source regions 11b and the heavily-doped p-type shallow source regions 19 encounter a problem in large resistance.

A solution is proposed in Japanese Patent Publication of Unexamined Application No. 62-176166, and the process sequence disclosed therein is hereinbelow referred to as "second prior art process". The second prior art process sequence is similar to the first prior art process sequence until the ion-implantation for the lightly-doped n-type source/drain regions 11a/12a, is completed and the steps through the formation of the lightly-doped n-type source/drain regions 11a/12a are omitted from the following description.

When the lightly-doped n-type source/drain regions 11a/12a are completed, a photo-resist ion-implantation mask 25 is formed on the resultant semiconductor structure, and covers the p-type well 4 and the gate electrode 8 over the p-type well 4. Boron is ion implanted into the n-type well 6 at dose of $1\times10^{13}$ to $2\times10^{13}$ cm$^{-2}$ under acceleration energy of 15 to 20 KeV as shown in FIG. 2A, and the ion-implanted boron forms lightly-doped p-type source/drain regions 26a/27a in a self-aligned manner with the gate electrode 9.

Silicon oxide is deposited to 400 nanometers to 500 nanometers thick over the entire surface of the resultant semiconductor structure by using the chemical vapor deposition, and the silicon oxide layers 7a/7b, the gate electrodes 8/9 and the thick field oxide layer 2 are covered with a silicon oxide layer 28 as shown in FIG. 2B.

The silicon oxide layer 28 is uniformly etched without an etching mask until 50 nanometers to 100 nanometers thick, and the residual silicon oxide forms incomplete wide side wall layer 28a. The incomplete wide side wall layers 28a has thick portions on both sides of each gate electrode 8/9.

A photo-resist ion-implantation mask 29 is formed on the incomplete wide side wall layer 28a by using the photo-lithographic techniques, and covers the n-type well 6. Phosphorous or arsenic is ion implanted into the p-type well 4 at dose of $5\times10^{15}$ to $1\times10^{16}$ cm$^{-2}$ under acceleration energy of 50 to 150 KeV as shown in FIG. 2C. The ion-implanted n-type dopant impurity forms heavily-doped n-type source/drain regions 30a and 30b in a self-aligned manner with the thick portions of the incomplete wide side wall spacer layer 28a, and the heavily-doped n-type source/drain regions 30a/30b are deeper than the lightly-doped n-type source/drain regions 11a/12a. The photo-resist ion-implantation mask 29 is stripped off.

A photo-resist ion-implantation mask 32 is patterned on the resultant semiconductor structure, and covers the p-type well 4. P-type dopant imnpurity such as boron or boron difluoride is ion implanted into the n-type well 6 at dose of $2\times10^{15}$ to $4\times10^{15}$ cm$^{-2}$ under acceleration energy of 30 to 90 KeV as shown in FIG. 2D. The ion-implanted p-type dopant impurity forms heavily doped p-type source/drain regions 26b/27b in a self-aligned manner with the thick portions of the incomplete wide side wall spacer layer 28a, and the heavily-doped p-type source/drain regions 26b/27b are deeper than the lightly-doped p-type source/drain regions 26a/27a, respectively. The photo-resist ion-implantation mask 32 is stripped off.

The incomplete wide side wall spacer layer 28a is etched without an etching mask by using a reactive ion etching technique until the heavily doped n-type source/drain regions 30a/30b and the heavily-doped p-type source/drain regions 26b/27b are exposed again, and side wall spacers 33 are formed on both side surfaces of each gate electrode 8/9.

Subsequently, the silicon substrate 1 is placed in dry oxidation ambience at 950 degrees in centigrade, and silicon oxide layers 34 is grown to 20 nanometers thick. While the silicon oxide layers 34 are being thermally grown, the ion-implanted n-type dopant impurity and the ion-implanted p-type dopant impurity are activated.

Subsequently, a photo-resist ion implantation mask 37 is formed over the n-type well 6 by using the photo-lithographic technique, and phosphorous or arsenic is ion implanted into the p-type well 4 at dose of $1\times10^{16}$ to $1.5\times10^{16}$ cm$^{-2}$ under acceleration energy of 40 to 50 KeV as shown in FIG. 2E. The phosphorous or the arsenic forms heavily-doped source/drain regions 38a/38b in a self-aligned manner with the side wall spacers 33 on both sides of the gate electrode 8. The heavily-doped n-type source/drain regions 38a/38b are deeper than the lightly-doped n-type source/drain regions 11a/12a, but are shallower than the heavily-doped n-type source/drain regions 30a/30b. Thus, the lightly-doped n-type source/drain regions 11a/12a, the heavily-doped n-type source/drain regions 30a/30b and the heavily-doped n-type source/drain regions 38a/38b are partially overlapped with one another. The photo-resist ion-implantation mask 37 is stripped off.

Subsequently, a photo-resist ion-implantation mask 40 is formed over the p-type well 4, and p-type dopant impurity such as boron or boron difluoride is ion implanted into the n-type well 6 at dose of $4\times10^{15}$ to $6\times10^{15}$ cm$^{-2}$ under acceleration energy of 25 to 30 KeV as shown in FIG. 2F. The boron or the boron difluoride form heavily-doped p-type source/drain regions 26c/27c in a self-aligned manner with the side wall spacers 33 on both side surfaces of the gate electrode 9. The heavily-doped p-type source/drain regions 26c/27c are deeper than the lightly-doped p-type source/drain regions 26a/27a, and are shallower than the heavily-doped p-type source/drain regions 26b/27b. Thus, the lightly-doped p-type source/drain regions 26a/27a, the heavily-doped p-type source/drain regions 26b/27b and the heavily-doped p-type source/drain regions 26c/27c are partially overlapped with one another. The photo-resist ion-implantation mask 40 is stripped off.

The resultant semiconductor structure is annealed in nitrogen ambience at 900 degrees to 950 degrees in centigrade for 20 minutes to 60 minutes, and the ion-implanted n-type dopant impurity and the ion-implanted p-type dopant impurity are activated. The lightly-doped n-type source/drain regions 11a/12a, the heavily-doped n-type source/drain regions 30a/30b and the heavily-doped n-type source/drain regions 38a/38b form in combination n-type LDD source/drain regions 41a/41b, and the lightly-doped p-type source/drain regions 26a/27a, the heavily-doped p-type source/drain regions 26b/27b and the heavily-doped p-type source/drain regions 26c/27c as a whole constitute p-type LDD source/drain regions 42a/42b as shown in FIG. 2G. The gate electrode 8, the silicon oxide layer beneath the gate electrode 8 and the n-type LDD source/drain regions 41a/41b as a whole constitute an n-channel enhancement type field effect transistor 43, and the gate electrode 9, the silicon oxide layer beneath the gate electrode 9 and the p-type LDD source/drain regions 42a/42b as a whole constitute a p-channel enhancement type field effect transistor 44.

Although the n-type LDD source/drain regions 41a/41b are formed through the three ion-implantation steps, the lightly-doped n-type source region 11a, the heavily-doped n-type source region 30a and the heavily-doped n-type source region 38a are concurrently formed together with the lightly-doped n-type drain region 12a, the heavily-doped n-type drain region 30b and the heavily-doped n-type drain region 38b, respectively, and, accordingly, have same depth as the lightly-doped n-type drain region 12a, the heavily-doped n-type drain region 30b and the heavily-doped n-type drain region 38b. Similarly, the lightly-doped p-type source region 26a, the heavily-doped p-type source region 26b and tile heavily-doped p-type source region 26c are concurrently formed together with the lightly-doped p-type drain regional 27a, the heavily-doped p-type drain region 27b and the heavily-doped p-type drain region 27c, respectively, and, accordingly, have same depth as the lightly-doped p-type drain region 27a, the heavily-doped p-type drain region 27b and the heavily-doped p-type drain region 27c.

The heavily-doped n-type/p-type source region 30a/26b are deeper than the heavily-doped n-type/p-type source regions of standard field effect transistor such as 11b and 19, and the n-type/p-type LDD source regions 41a/42a are effective against the increase of the source resistance due to the scaling-down. However, the punch-through phenomenon is liable to take place in the second prior art field effect transistors 43/44, and the transistor characteristics are not stable. Moreover, the second prior art process is complicated, and suffers from low production yield.

SUMMARY OF THE INVENTION

It is therefore an important object of the present invention to provide a field effect transistor which prevents the punch-through phenomenon without increase of the source resistance.

It is also an important object of the present invention to provide a process for fabricating the field effect transistor which is simple and improved in production yield.

The present inventor contemplated the problems inherent in the second prior art field effect transistor and the second prior art process. The present inventor noticed that the impurity profile of the LDD source/drain region 41a/41b/42a/42b was not constant. The present inventor found that the side wall spacers 33 tended to vary the width from the side surfaces of the gate electrode 8/9 due to the reactive ion etching repeated twice. The distance between the n-type/p-type source region and the n-type/p-type drain region was short in a product and was long in another product. This resulted in the unstable transistor characteristics and the punch-through phenomenon.

To accomplish the object, the present invention proposes to form a mask through a single etching step.

In accordance with one aspect of the present invention, there is provided a semiconductor device fabricated on a semiconductor substrate and comprising an isolating region selectively formed in the semiconductor substrate and defining at least a first active area in a surface of the semiconductor substrate, and a first field effect transistor assigned the first active area, and the first field effect transistor includes a first gate insulating layer formed on a certain sub-area of the first active area, a first gate electrode formed on the first gate insulating layer, a first drain region formed in the first active area on one side of the certain sub-area and a first source region formed in the first active area on the other side of the certain sub-area and having a p-n junction defining a bottom surface thereof and deeper than a p-n junction defining a bottom surface of the first drain region.

In accordance with another aspect of the present invention, there is provided a process for fabricating a semiconductor device, comprising the steps of: a) preparing a semiconductor substrate including at least a first active area having a first sub-area, a second sub-area on one side of the first sub-area and a third sub-area on the other side of the first sub-area; b) forming a first gate insulating layer on the first sub-area, c) forming a first gate electrode on the first gate insulating layer; d) covering the second sub-area with a spacer layer; and e) ion implanting a first dopant impurity into the second sub-area and the third sub-area so as to form a shallow drain region and a deep source region in the second sub-area and the third sub-area, respectively.

In accordance with yet another aspect of the present invention, there is provided a process for fabricating a semiconductor device, comprising the steps of: a) preparing a semiconductor substrate including at least an active area having a first sub-area, a second sub-area on one side of the first sub-area and a third sub-area on the other side of the first sub-area, b) forming a gate insulating layer on the first sub-area; c) forming a gate electrode on the gate insulating layer; and d) repeating an ion-implantation under different accelerating energy so as to form a shallow drain sub-region in the second sub-area and a deep source sub-region in the third sub-area, respectively.

BRIEF DESCRIPTION OF THE DRAWINGS

The features and advantages of the semiconductor device and the process will be more clearly understood from the following description taken in conjunction with the accompanying drawings in which:

FIGS. 1A to 1J are cross sectional views showing the essential steps of the first prior art process;

FIG. 5 is a cross sectional view showing the structure of another semiconductor device according to the present invention.

DESCRIPTION OF THE PREFERRED EMBODIMENTS

First Embodiment

Figure 1D:
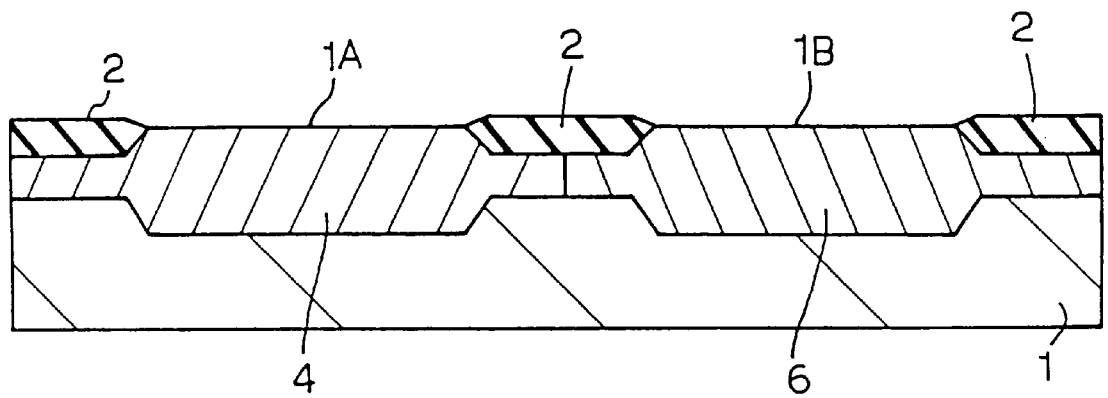
Figure 1E:
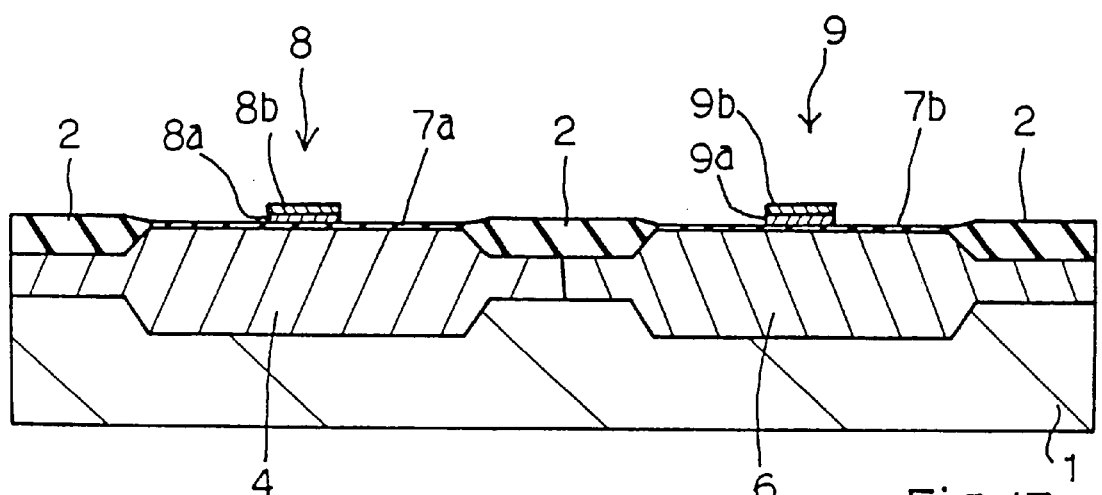
Figure 1F:
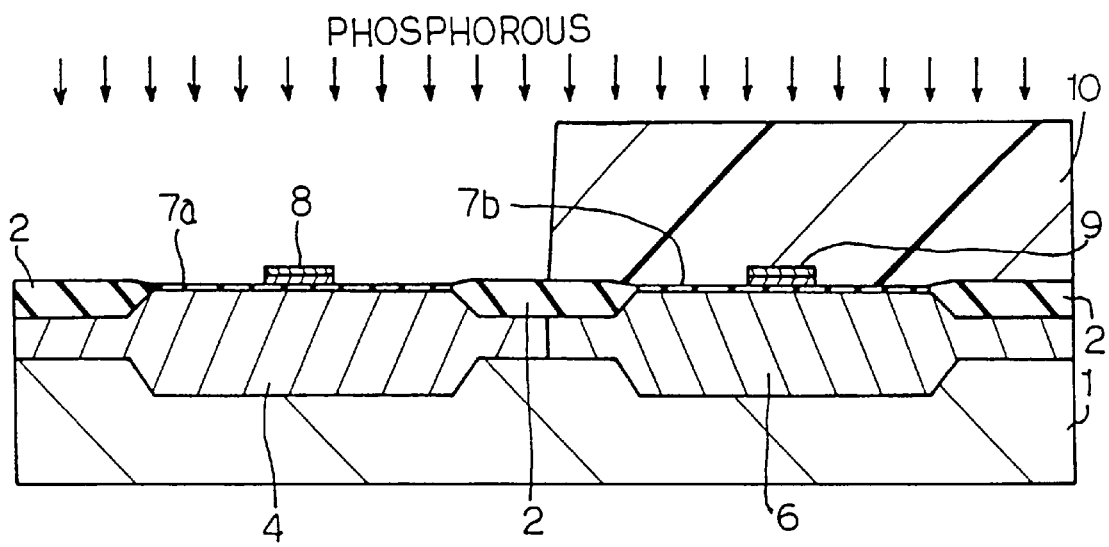
Figure 1G:
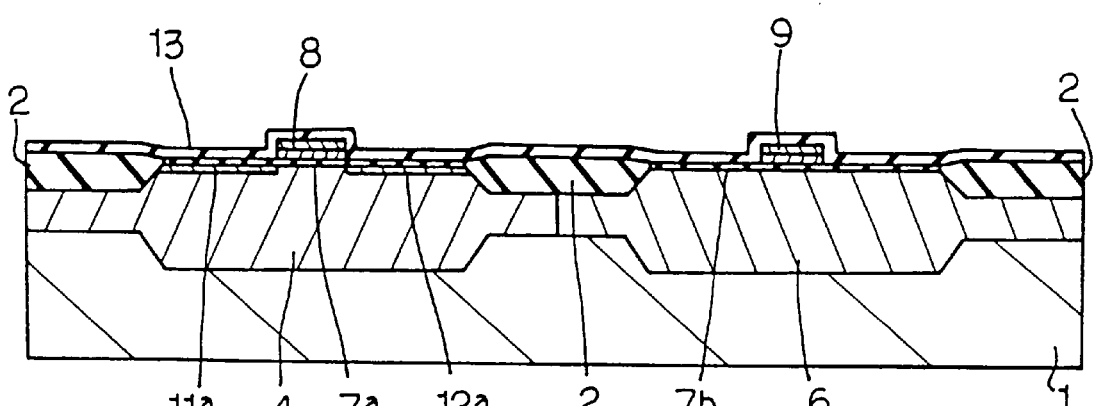
Figure 1H:
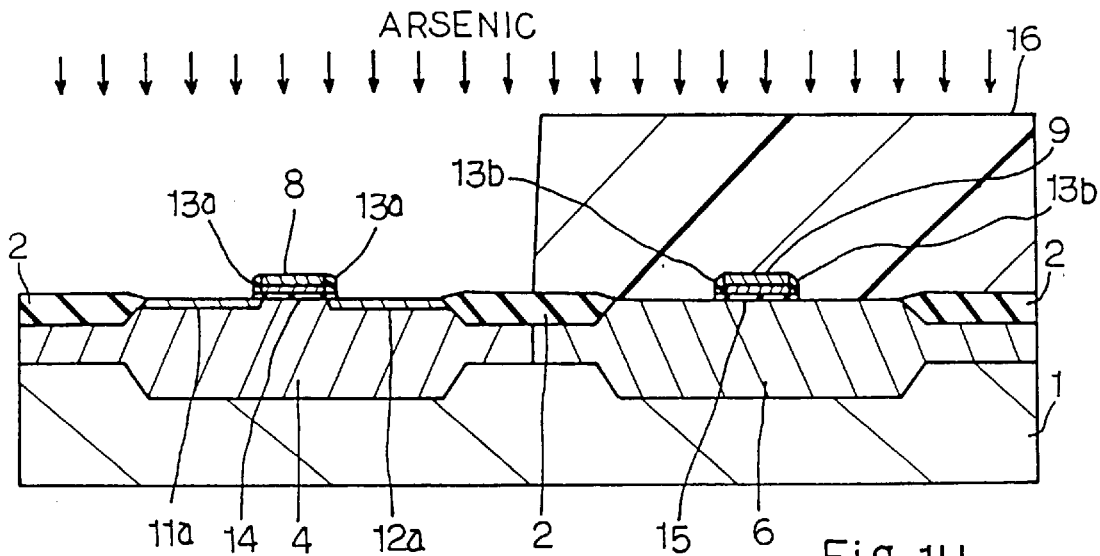
Figure 1I:
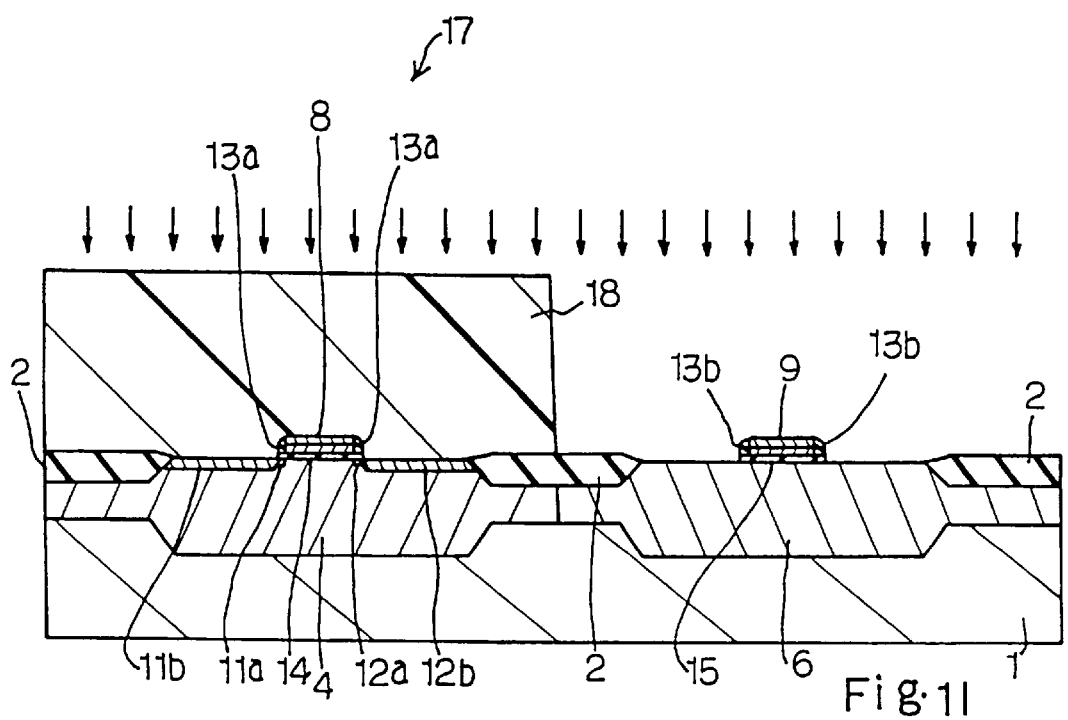
Figure 1J:
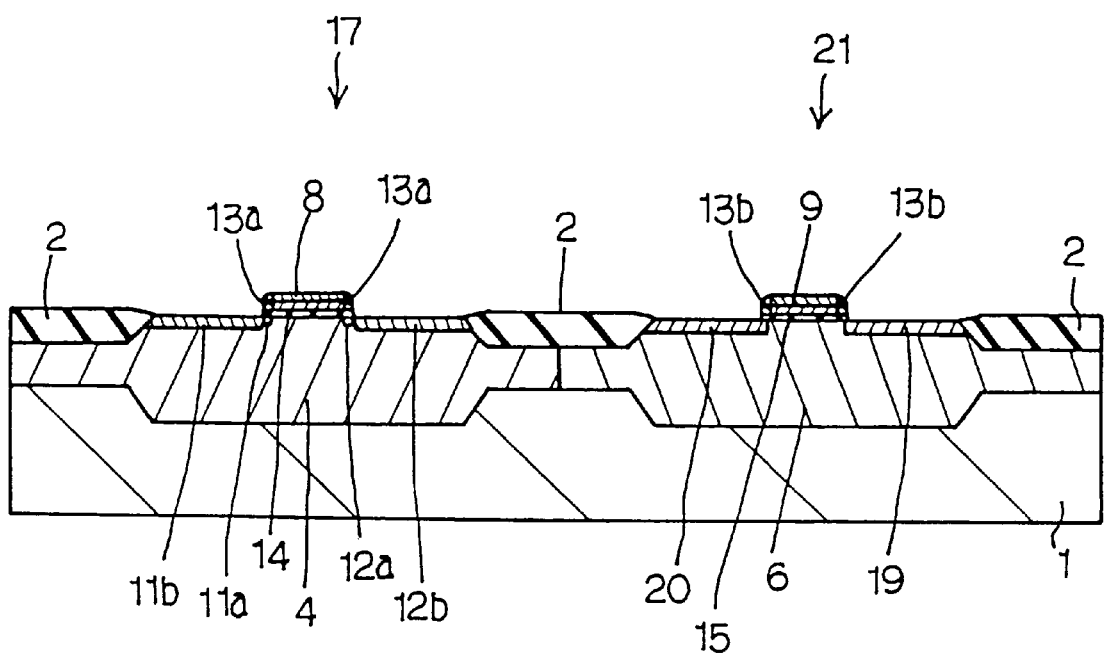
Figure 2A:
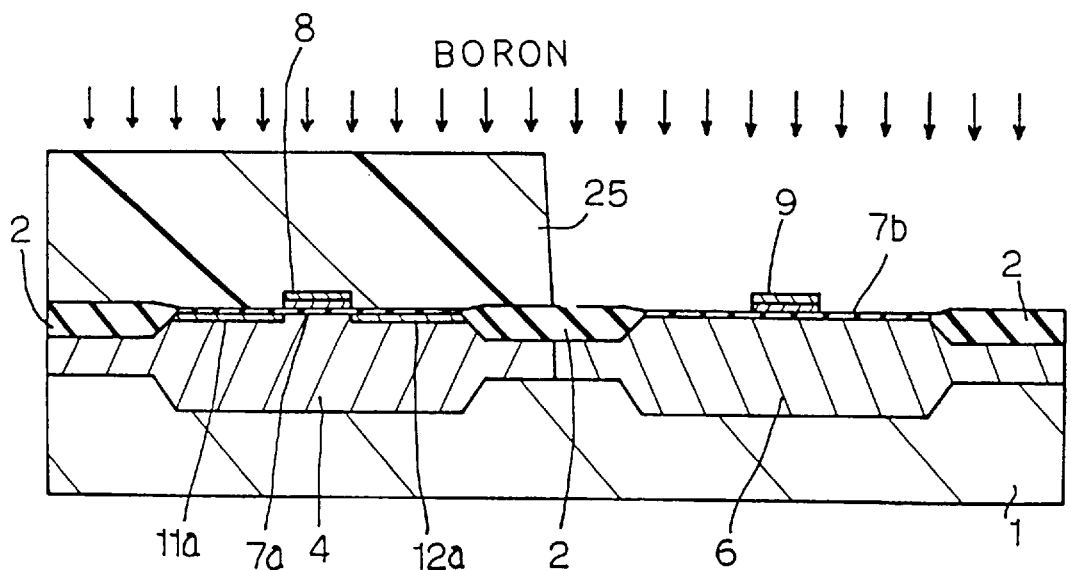
FIGS. 2A to 2G are cross sectional views showing the essential steps of the second prior art process.
Figure 2B:
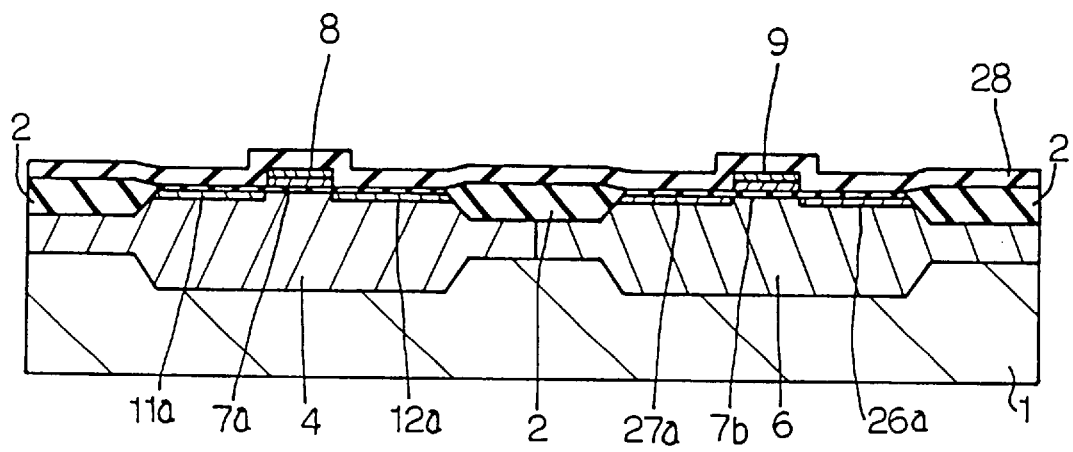
Figure 2C:
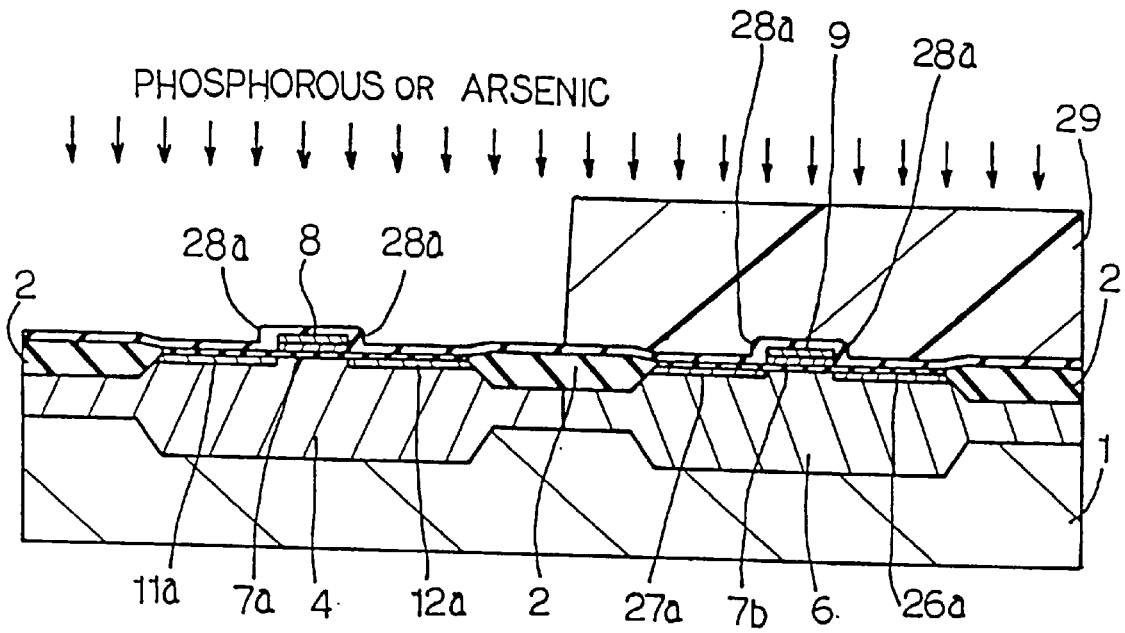
Figure 2D:
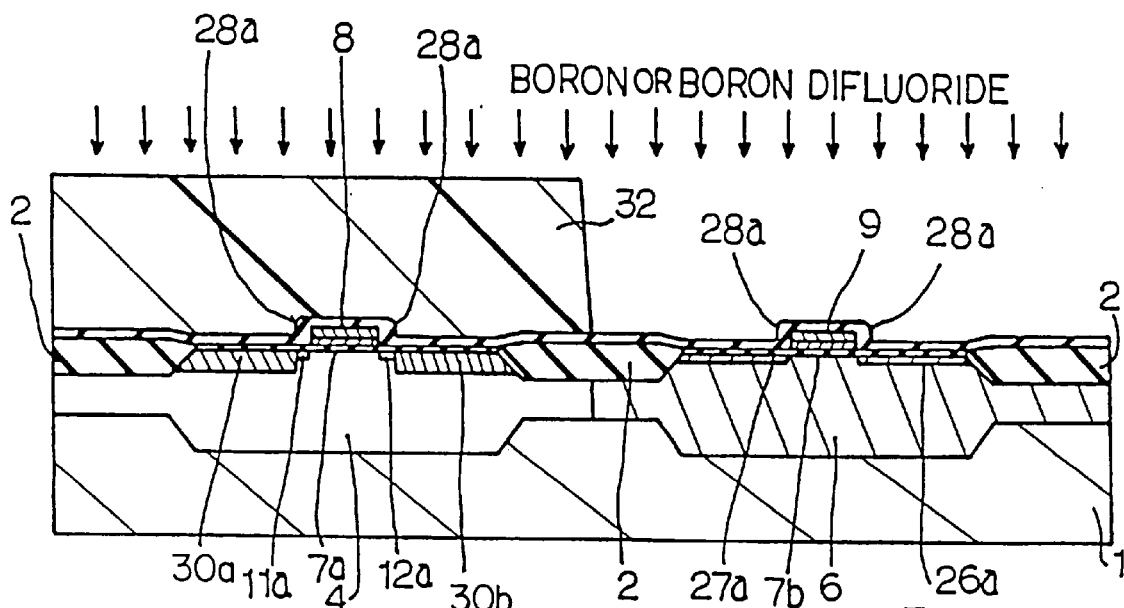
Figure 2E:
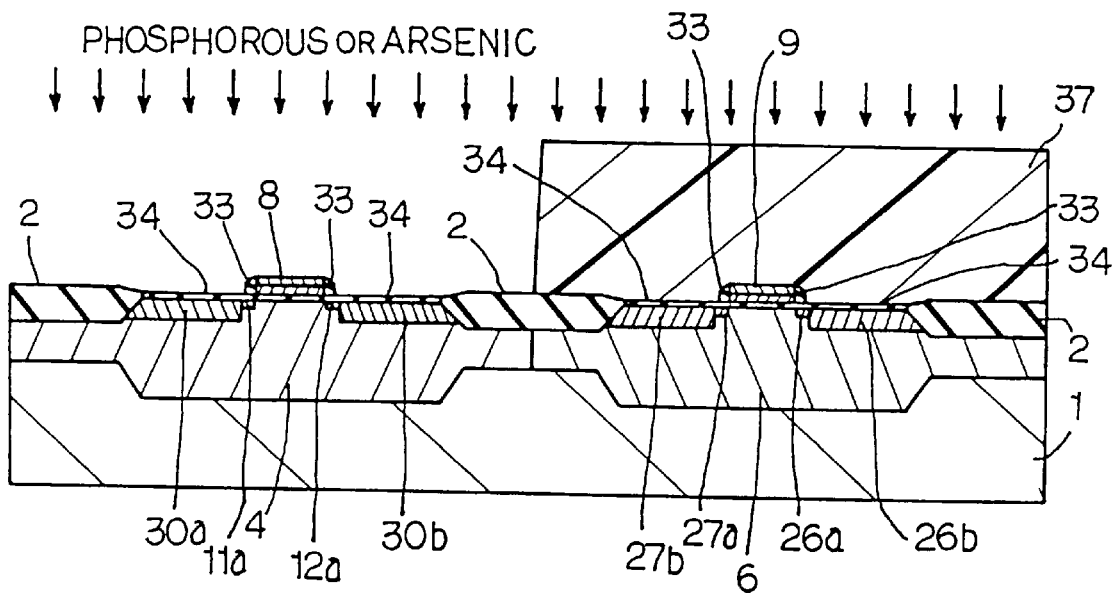
Figure 2F:
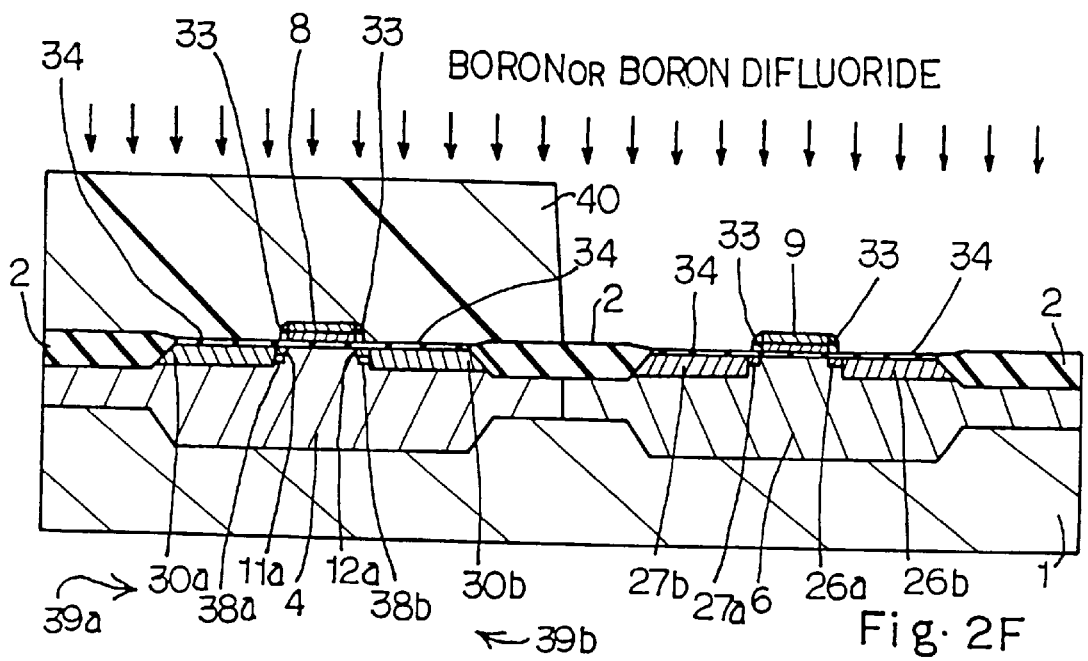
Figure 2G:
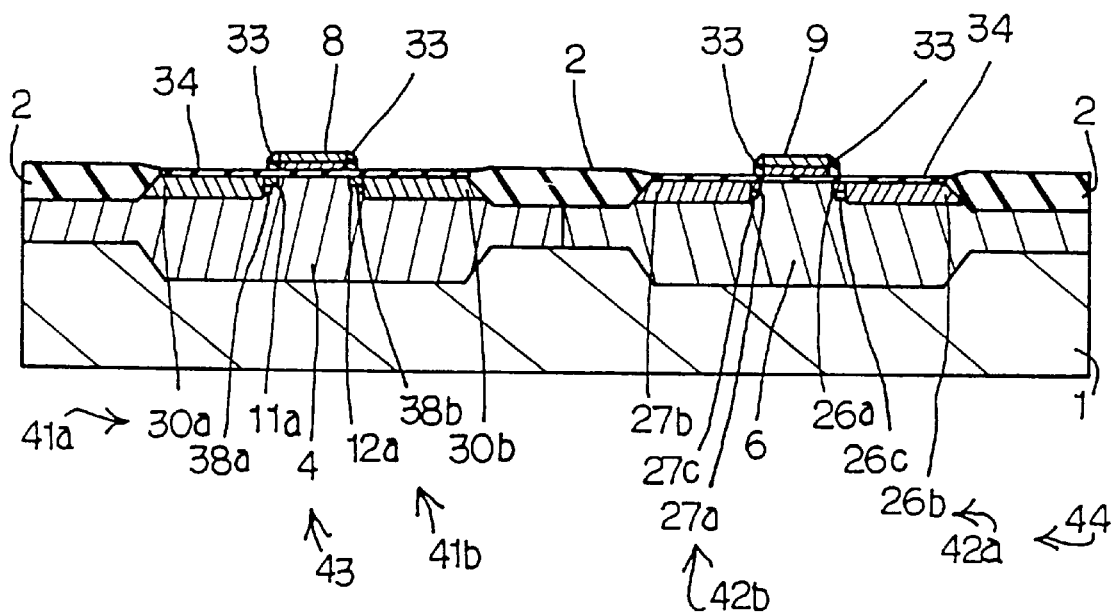
Figure 3:
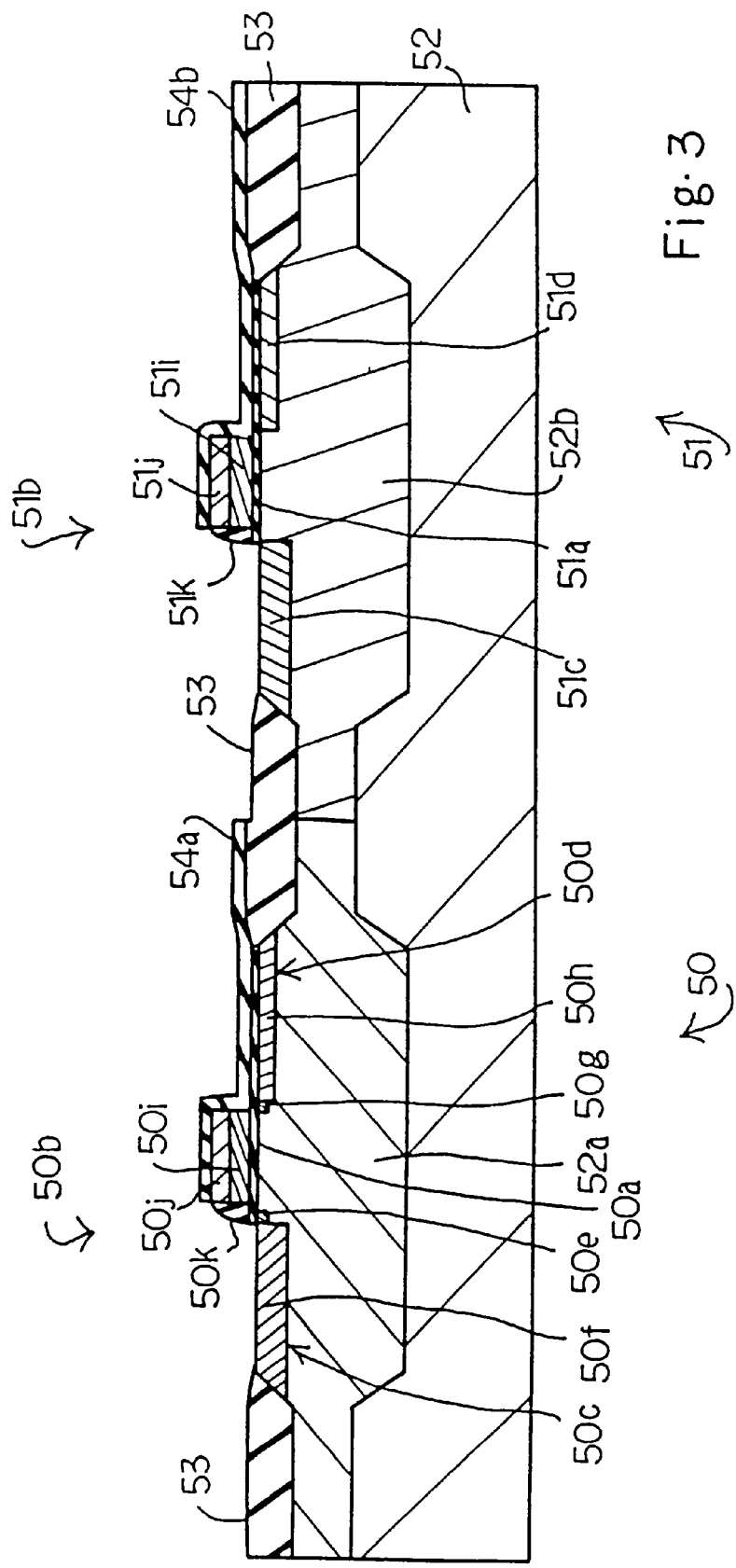
FIG. 3 is a cross sectional view showing the structure of a semiconductor device according to the present invention.

Referring to FIG. 3 of the drawings, an n-channel type field effect transistor 50 and a p-channel type field effect transistor 51 are fabricated on a silicon substrate 52. A p-type well 52a and an n-type well 52b are formed in a surface portion of the silicon substrate 52. A thick field insulating layer 53 defines active areas in the p-type well 52a and the n-type well 52b, and the active areas are respectively assigned to the n-channel type field effect transistor 50 and the p-channel type field effect transistor 51.

The n-channel type field effect transistor 50 comprises a gate insulating layer 50a formed on a channel region, a gate electrode 50b formed on the gate insulating layer 50a, an n-type LDD source region 50c formed on one side of the channel region and an n-type LDD drain region 50d formed on the other side of the channel region. The n-type LDD source region 50c is deeper than the n-type LDD drain region 50d, and a lightly-doped n-type source sub-region and a heavily-doped n-type LDD source sub-region 50e/50f and a lightly-doped n-type drain sub-region and a heavily-doped n-type drain sub-region 50g/50h form the n-type LDD source regional 50c and the n-type LDD drain region 50d, respectively. A polysilicon strip 50i and a refractory metal silicide layer 50j constitute the gate electrode 50b, and the refractory metal silicide layer 50j may be formed of tungsten silicide or titanium silicide. Thus, the gate electrode 50b has the salicide structure.

The inner end of the lightly-doped n-type source sub-region 50e and the inner end of the lightly-doped n-type drain sub-region 50g are aligned with both end surfaces of the gate electrode 50b. A side wall spacer 50k is formed on a side surface of the gate electrode 50b over the n-type LDD source region 50c, and the inner end of the heavily-doped n-type source sub-region 50f is substantially aligned with the side wall spacer 50k. A spacer layer 54a of silicon oxide extends over the n-type LDD drain region 50d, and the other side surface and the upper surface of the gate electrode 50b are covered with the spacer layer 54a. The spacer layer 54a ranges from 100 nanometers to 150 nanometers thick, and consumes the projection range of the n-type dopant impurity ion implanted into the p-type well 52a. The spacer layer 54a on the side surface of the gate electrode 50b is thick enough to block the p-type well 52a from the n-type ion-implanted dopant impurity, and the inner end of the heavily-doped n-type drain sub-region 50h is aligned with the vertical surface of the spacer layer 54a on the other side surface of tile grate electrode 50b.

The p-channel type field effect transistor 51 comprises a gate insulating layer 51a formed on a channel region, a gate electrode 51b formed on the gate insulating layer 51a, a p-type source region 51c formed on one side of the channel region and a p-type drain region 51d formed on the other side of the channel region. The p-type source region 51c is deeper than the p-type drain region 51d. A polysilicon strip 51i and a refractory metal silicide layer 51j constitute the gate electrode 51b, and the refractory metal silicide layer 51j is formed of the same material as the refractory metal silicide layer 50j.

A side wall spacer 51k is formed on a side Surface of the gate electrode 51b over the p-type source region 51c. A spacer layer 54b of silicon oxide extends over the p-type drain region 51d, and the other side surface and the upper surface of the gate electrode 51b are covered with the spacer layer 54b. The spacer layer 54b is as thick as the spacer layer 54a, and consumes the projection range of the p-type dopant impurity ion implanted into the n-type well 52b. The spacer layer 54b on the side surface of the gate electrode 51b is thick enough to block the n-type well 52b from the p-type ion-implanted dopant impurity.

Figure 4A:
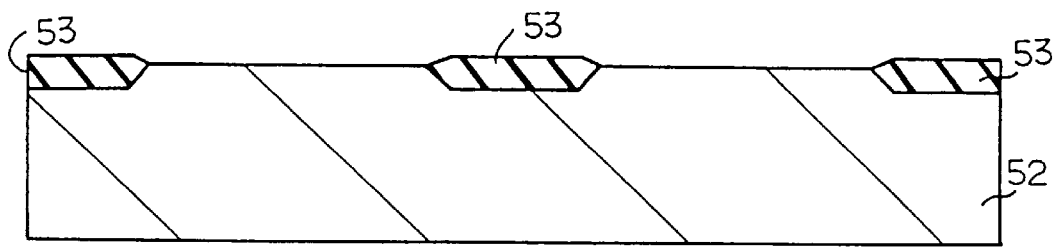
FIGS. 4A to 4J are cross sectional views showing essential steps of a process according to the present invention.

FIGS. 4A to 4J illustrate a process of fabricating the semiconductor device. The process starts with preparation of a preparation of the silicon substrate 52. A thick field insulating layer 53 is selectively grown to 400 nanometers thick in the surface portion of the silicon substrate 52 by using the LOCOS technique. The thick field insulating layer 53 defines active areas 52A and 52B as shown in FIG. 4A, and the active areas 52A and 52B are respectively assigned to the n-channel type field effect transistor 50 and the p-channel type field effect transistor 51.

Figure 4B:
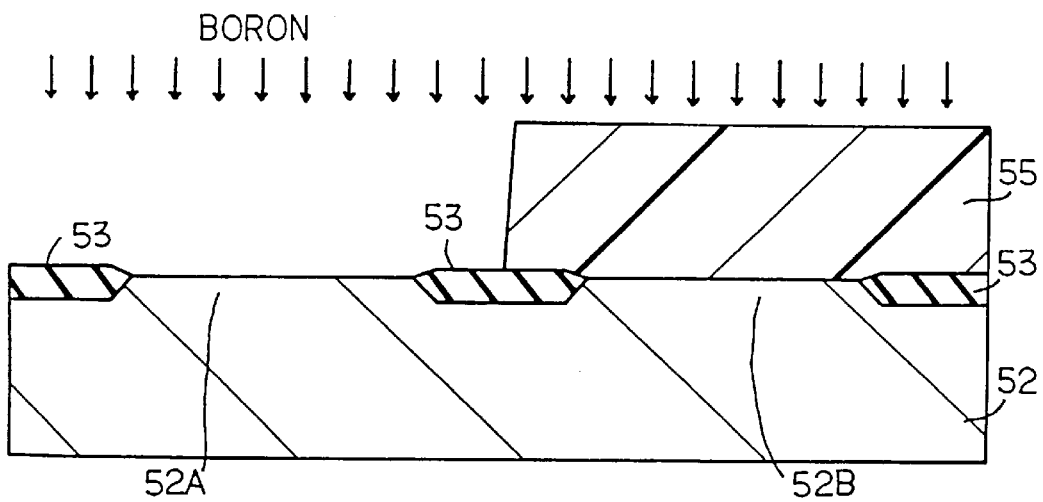

Subsequently, a photo-resist ion-implantation mask 55 is patterned through the photo-lithographic techniques. The photo-resist ion-implantation mask 55 covers the active area 52B assigned to the p-channel type field effect transistor 51. Boron is ion implanted into the active area 52A at dose of $1 \times 10^{13}$ to $2 \times 10^{13}$ cm$^{-2}$ under acceleration energy of 300 KeV as shown in FIG. 4B, and the ion-implanted boron forms the p-type well 52a in the active area 52A. A channel doping is further carried out for the n-channel type field effect transistor 50.

Figure 4C:
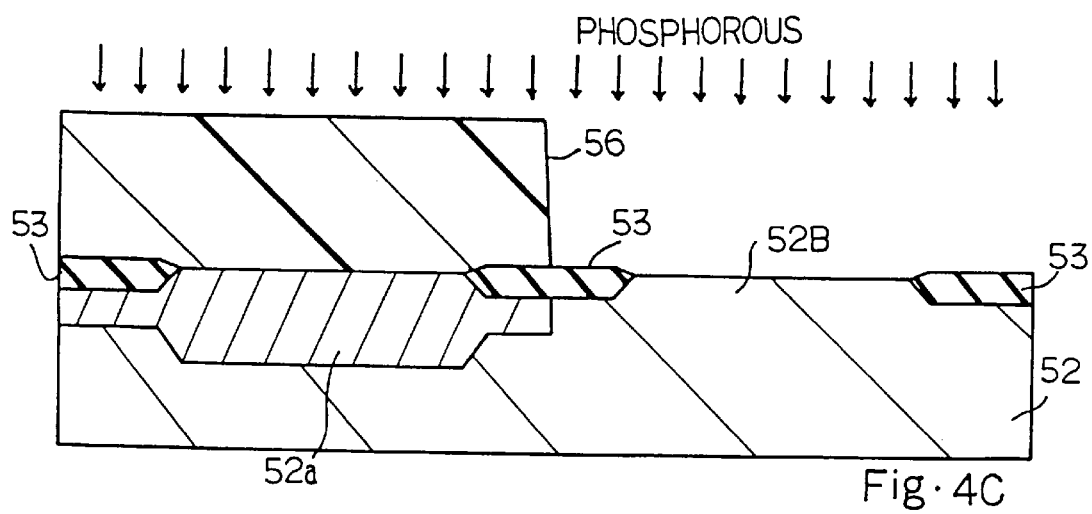
Figure 4D:
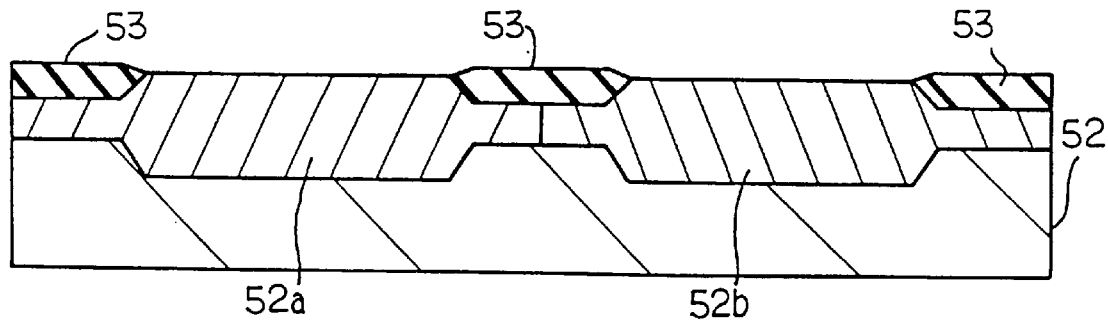

The photo-resist ion-implantation mask 55 is stripped off, and another photo-resist ion-implantation mask 56 is formed on the p-type well 52a by using the photo-lithographic techniques. Using the photo-resist ion-implantation mask 56, phosphorous is ion implanted into the active area 52B at dose of $1 \times 10^{13}$ to $2 \times 10^{13}$ cm$^{-2}$ under acceleration energy of 700 KeV as shown in FIG. 4C. A channel doping is also carried out for the p-channel type field effect transistor 51. The ion-implanted phosphorous forms the n-type well 52b in the active area 52B, and the photo-resist ion-implantation mask 56 is stripped off. The resultant semiconductor structure is shown in FIG. 4D.

Subsequently, a surface portion of the p-type well 52a and a surface portion of the n-type well 52b are thermally oxidized so as to form silicon oxide layers 57a/57b of 8 nanometers thick. Polysilicon is deposited to 100 nanometers thick over the entire surface of the resultant semiconductor structure by using a chemical vapor deposition, and, thereafter, refractory metal silicide such as titanium silicide or tungsten silicide is deposited to 100 nanometers thick over the polysilicon layer by using a sputtering. Thus, the polysilicon layer and the refractory metal silicide layer are laminated over the resultant semiconductor structure. Parts of the silicon oxide layers 57a/57b beneath the gate electrodes 50b/51b serve as the gate insulating layers 50a/51a.

Figure 4E:
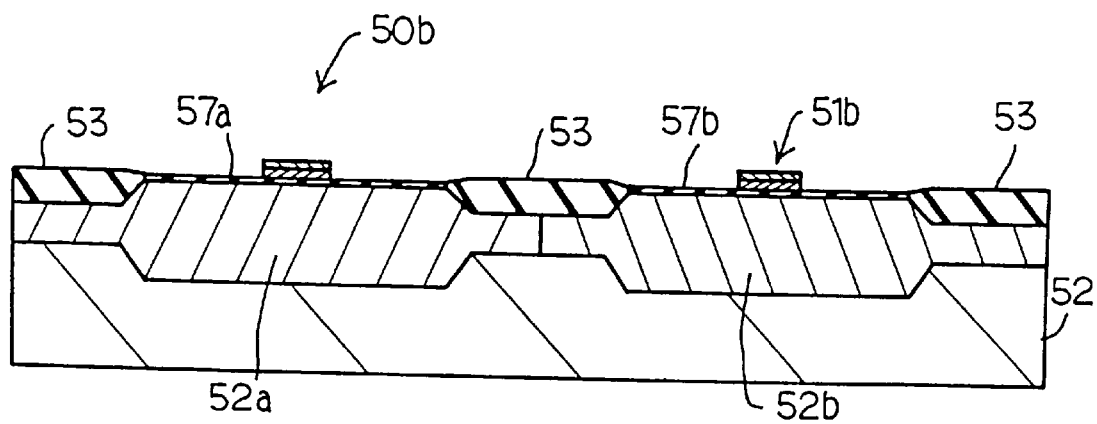

A photo-resist etching mask (not shown) is formed on the refractory metal silicide layer by using the photo-lithographic techniques, and covers predetermined areas of the refractory metal silicide layer for gate electrodes. Using the photo-resist etching mask, the refractory metal silicide layer and the polysilicon layer are selectively etched away, and the gate electrodes 50b and 51b are patterned on the silicon oxide layers 57a/57b, respectively, as shown in FIG. 4E.

Figure 4F:
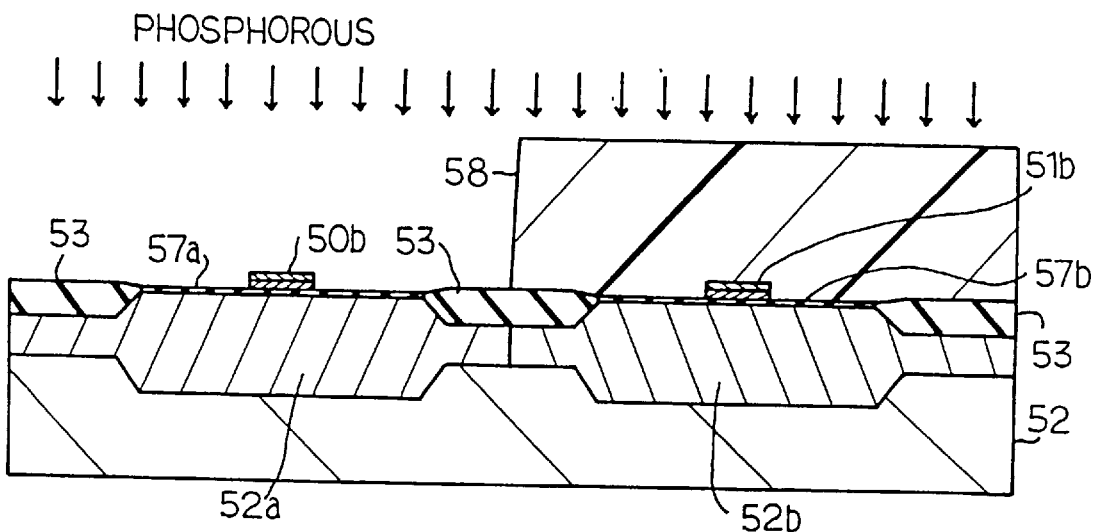

Subsequently, a photo-resist ion-implantation mask 58 is formed on the resultant semiconductor structure by using the photo-lithographic techniques, and covers the n-type well 52b. Phosphorous is ion implanted into the p-type well 52a at dose of $1 \times 10^{13}$ to $2 \times 10^{13}$ cm$^{-2}$ under acceleration energy of 15 to 25 KeV as shown in FIG. 4F, and forms the lightly doped n-type source/drain sub-regions 50e/50g in a self-aligned manner with the gate electrode 50b. The photo-resist ion-implantation mask 58 is stripped off.

Figure 4G:
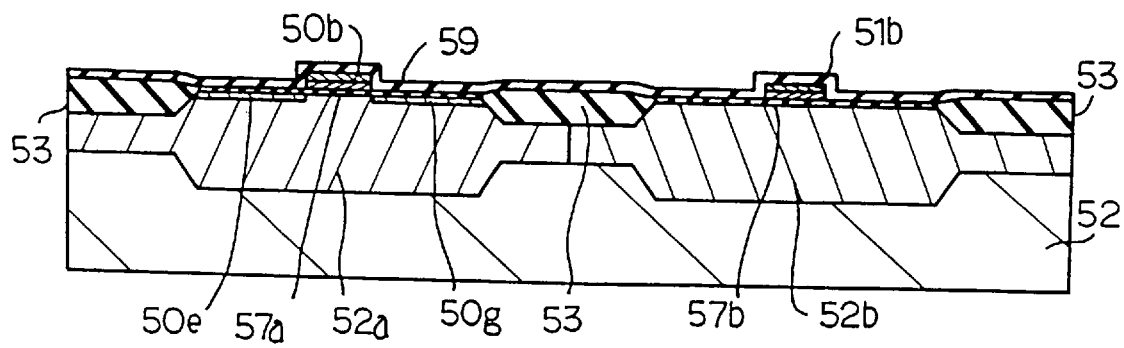

Silicon oxide is deposited to 100 nanometers to 150 nanometers thick over the entire surface of the resultant semiconductor structure by using a chemical vapor deposition, and the thick field insulating layer 53, the silicon oxide layers 57a/57b and the gate electrodes 50b/51b are covered with a silicon oxide layer 59 as shown in FIG. 4G.

Figure 4H:
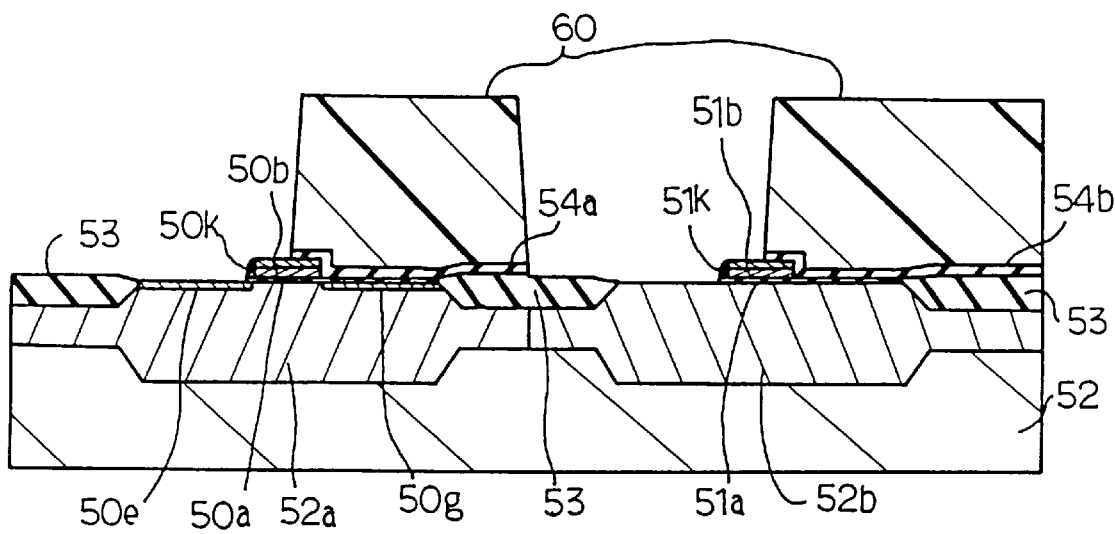

A photo-resist etching mask 60 is formed on the silicon oxide layer 59 by using the photo-lithographic techniques, and has opening over the lightly-doped n-type source sub-region 50e and an area of the n-type well 52b assigned to the p-type source region. Using the photo-resist etching mask 60, the silicon oxide layers 59 and 57a/57b are etched until the lightly-doped n-type source sub-region 50e and the n-type well 52b are exposed. Then, the side wall spacers 50k/51k are formed on the left side surfaces of the gate electrodes 50b/51b, respectively, and the spacer layers 54a/54b are left under the photo-resist etching mask 60 as shown in FIG. 4H. The side wall spacers 50k/51k ranges from 80 nanometers to 130 nanometers thick. The side wall spacers 50k/51k and the spacer layers 54a/54b may be formed of silicon nitride.

Figure 4I:
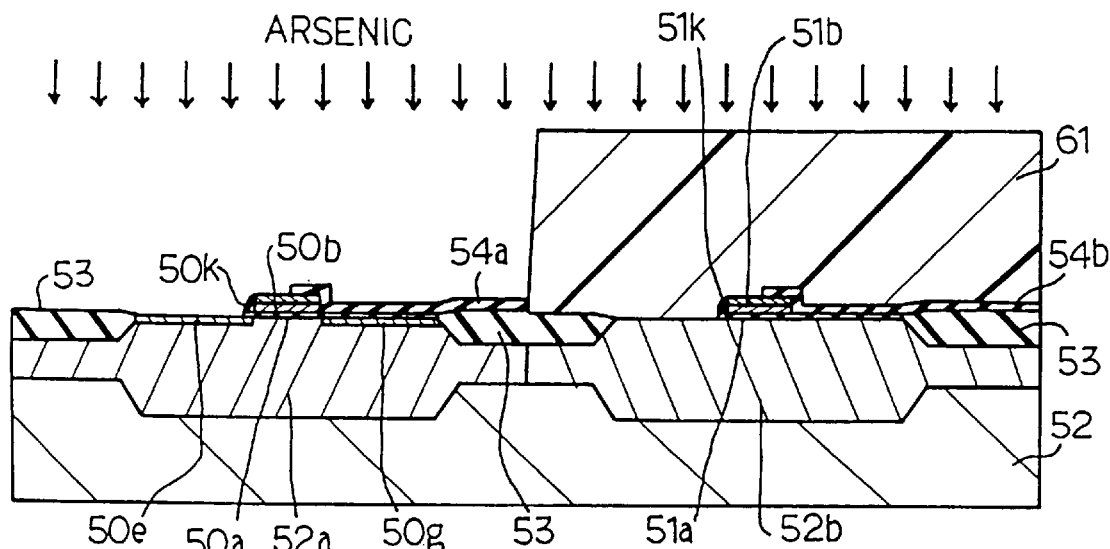

The photo-resist etching mask 60 is stripped off, and a photo-resist ion-implantation mask 61 is formed over the n-type well 52b. Arsenic is ion implanted into the p-type well 52a at dose of $3 \times 10^{15}$ to $5 \times 10^{15}$ cm$^{-2}$ under acceleration energy of 130 to 150 KeV as shown in FIG. 4I. The heavily-doped source sub-region 50f is formed in a self-aligned manner with the side wall spacer 50k, and the heavily doped n-type drain sub-region 50h is formed in a self-aligned manner with the vertical surface of the spacer layer 54a. The spacer layer 54a consumes the projection range of the ion-implanted arsenic, and, for this reason, the heavily-doped n-type drain sub-region 50h is shallower than the heavily-doped n-type source sub-region 50f. The photo-resist ion-implantation mask 61 is stripped off.

Figure 4J:
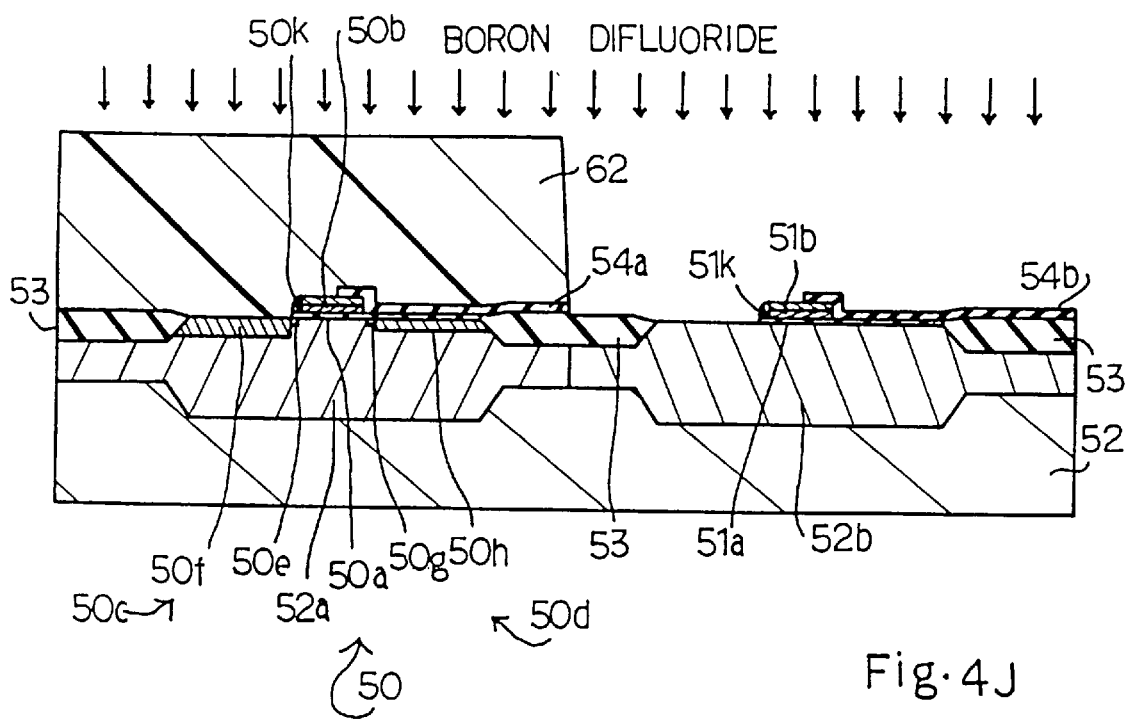

A photo-resist ion-implantation mask 62 is formed on the p-type well 52a, and boron difluoride is ion implanted into the n-type well 52b at dose of $1 \times 10^{15}$ to $2 \times 10^{15}$ cm$^{-2}$ under acceleration energy of 100 to 130 KeV as shown in FIG. 4J. The ion-implanted boron difluoride forms the heavily-doped p-type source region 51c in a self-aligned manner with the side wall spacer 51k, and further forms the heavily-doped p-type drain region 51d in a self-aligned manner with the part of the spacer layer 54b on the side surface of the gate electrode 51b. The resultant semiconductor structure is illustrated in FIG. 3.

The ion-implanted n-type/p-type dopant impurities are activated during a heat treatment thereafter.

As will be understood from the foregoing description, the n-type source sub-region 50f and the p-type source region 51c are so thick that they sufficiently supply the ground potential and the positive power potential to the n-channel type field effect transistor 50 and the p-channel type field effect transistor 51. In other words, the source resistance is low enough to supply the ground potential and the positive power potential to the field effect transistors 50/51 without delay.

Moreover, the n-type LDD source/drain regions 50c/50d have impurity profiles as designed, and the reproducibility is surely improved. In detail, the side wall spacers 50k/51k and the spacer layers 54a/54b are simultaneously patterned through the single etching step, and fall within target dimensions. In this situation, the ion-implantation results in impurity profiles matched with the target profiles, and the n-channel type field effect transistor 50 and the p-channel type field effect transistor 51 achieve the designed transistor characteristics. The transistor characteristics fluctuate less and the punch-through phenomenon does not take place under the designed conditions.

Second Embodiment

FIG. 5 illustrates the structure of another semiconductor device embodying the present invention. The semiconductor device includes an n-channel type field effect transistor 71 and a p-channel type field effect transistor 72, and the n-channel enhancement type field effect transistor 71 and the p-channel type field effect transistor 72 are fabricated on a silicon substrate 73. A p-type well 73a and an n-type well 73b are formed in a surface portion of the silicon substrate 73, and a thick field insulating layer 74 defines active areas assigned to the n-channel type field effect transistor 71 and the p-channel type field effect transistor 72, respectively.

The n-channel type field effect transistor 71 comprises a gate insulating layer 71a formed on a channel region, a gate electrode 71b formed on the gate insulating layer 71a, an n-type LDD source region 71c formed on one side of the channel region and an n-type LDD drain region 71d formed on the other side of the channel region. The n-type LDD source region 71c is deeper than the n-type LDD drain region 71d, and a lightly-doped n-type source sub-region and a heavily-doped n-type LDD source sub-region 71e/71f and a lightly-doped n-type drain-sub-region and a heavily-doped n-type drain sub-region 71g/71h form the n-type LDD source region 71c and the n-type LDD drain region 71d, respectively. A polysilicon strip 71i and a refractory metal silicide layer 71j constitute the gate electrode 71b as similar to the gate electrode 50b. Side wall spacers 71k/71m are formed on both side surfaces of the gate electrode 71b, and are formed of silicon oxide or silicon nitride.

The inner end of the lightly-doped n-type source sub-region 71e and the inner end of the lightly-doped n-type drain sub-region 71g are substantially aligned with both end surfaces of the gate electrode 71b, and the inner end of the heavily-doped n-type source sub-region 71f and the inner end of the heavily-doped n-type drain sub-region 71h are substantially aligned with the outer ends of the side wall spacers 71k/71m, respectively. The heavily-doped n-type source sub-region 71f is deeper than the heavily-doped n-type drain region 71h.

The p-channel type field effect transistor 72 comprises a gate insulating layer 72a formed on a channel region, a gate electrode 72b formed on the gate insulating layer 72a, a p-type source region 72c formed on one side of the channel region and a p-type drain region 72d formed on the other side of the channel region. The p-type source region 72c is deeper than the p-type drain region 72d. A polysilicon strip 72i and a refractory metal silicide layer 72j constitute the gate electrode 72b, and the refractory metal suicide layer 72j is formed of the same material as the refractory metal suicide layer 71j.

Side wall spacers 72k and 72m are formed on both side surfaces of the gate electrode 72b, and the inner ends of the heavily-doped p-type source/drain regions 72c/72d are substantially aligned with the outer surfaces of the side wall spacers 72k/72m, respectively. The heavily-doped source region 72c is deeper than the heavily-doped drain region 72d.

The semiconductor device shown in FIG. 5 is fabricated through a process described hereinbelow. The process is similar to that for the first embodiment until the silicon oxide/nitride layer 59 is deposited over the entire surface (see FIG. 4G), and only the later part of the process is described with reference to FIGS. 6A to 6E.

Figure 6A:
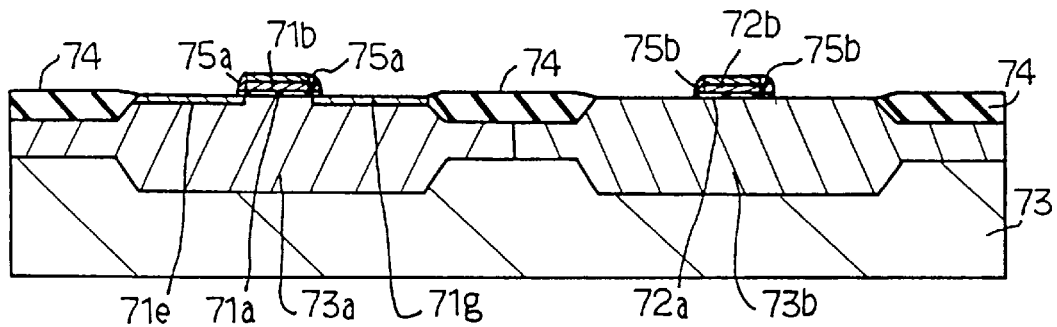
FIGS. 6A to 6E are cross sectional views showing essential steps of another process according to the present invention.

The silicon oxide/nitride layer 59 is etched back without a mask until the lightly-doped source/drain sub-regions 71e/71g and the n-type well 73b are exposed, and side wall spacers 75a and 75b are formed on both side surfaces of the gate electrode 71b and both side surfaces of the gate electrode 72b, respectively. The resultant semiconductor structure is shown in FIG. 6A.

Figure 6B:
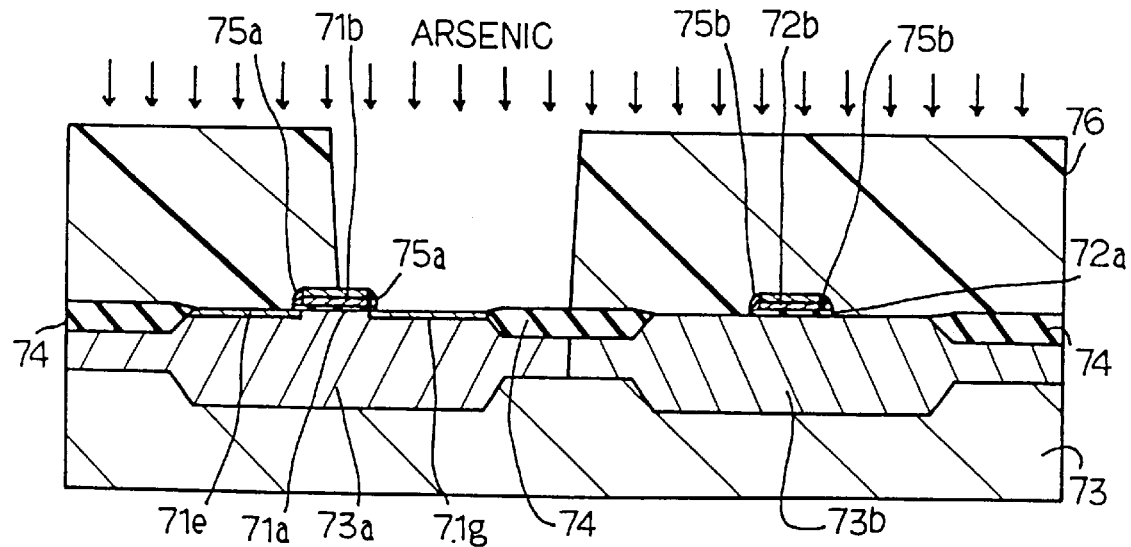

A photo-resist ion-implantation mask 76 is formed on the resultant semiconductor structure, and has an opening over the lightly-doped n-type drain sub-region 71g and a half of the gate electrode 71b. Arsenic is ion implanted into the exposed area of the p-type well 73a at dose of $3\times10^{15}$ to $5\times10^{15}$ cm$^{-2}$ under acceleration energy of 30 to 40 KeV as shown in FIG. 6B. The ion-implanted arsenic forms the heavily-doped n-type drain sub-region 71h.

Figure 6C:
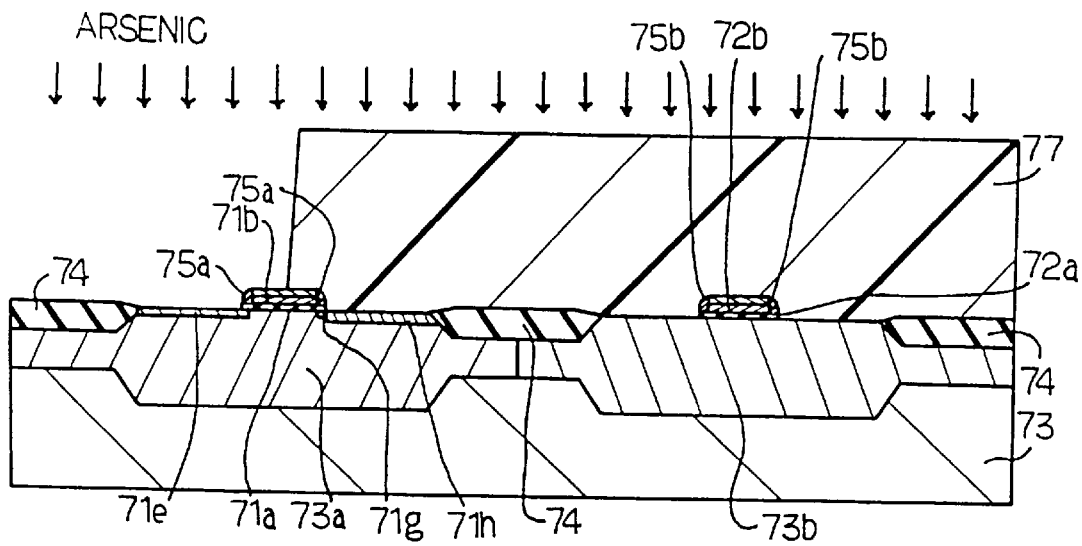

The photo-resist ion-implantation mask 76 is stripped off, and a photo-resist ion-implantation mask 77 is formed over the resultant semiconductor structure. The photo-resist ion-implantation mask 77 has an opening over the lightly-doped n-type source sub-region 71e, and the other half of the gate electrode 71b, and the arsenic is ion implanted into the exposed area of the p-type well 73a at dose of $3\times10^{15}$ to $5\times10^{15}$ cm$^{-2}$ under acceleration energy of 130 to 150 KeV as shown in FIG. 6C. The ion-implanted arsenic forms the heavily-doped n-type source sub-region 71f. The photo-resist ion-implantation mask 77 is stripped off.

Figure 6D:
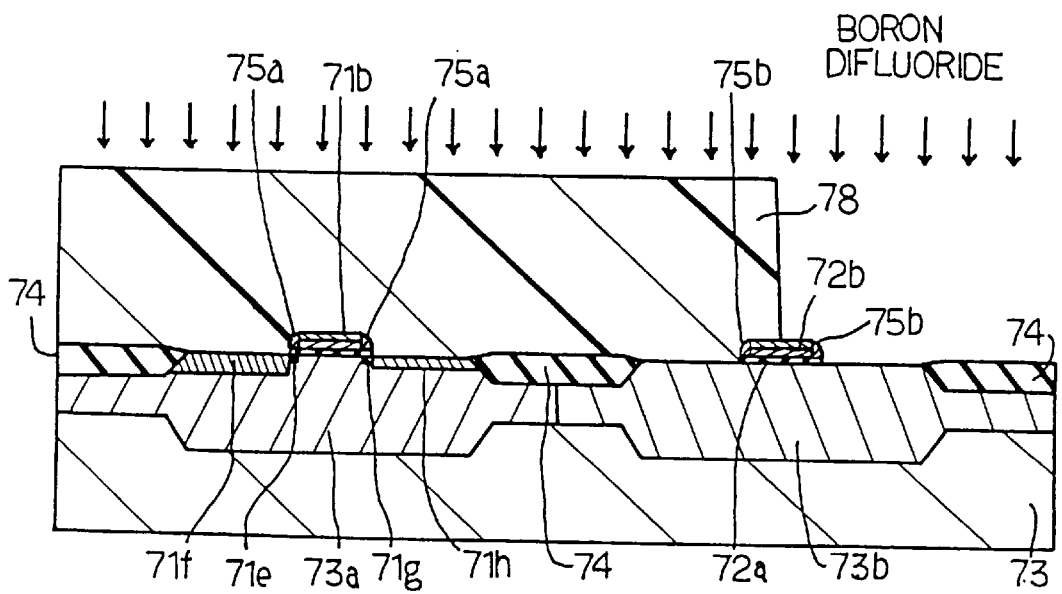

A photo-resist ion-implantation mask 78 is formed over the resultant semiconductor structure, and has an opening over a right half area of the n-type well 73b. Boron difluoride is ion implanted into the right half area at dose of $1\times10^{15}$ to $2\times10^{15}$ cm$^{-2}$ under acceleration energy of 30 to 50 KeV as shown in FIG. 6D. The ion-implanted boron difluoride forms the p-type drain region 72d, and the photo-resist ion-implantation mask 78 is stripped off.

Figure 6E:
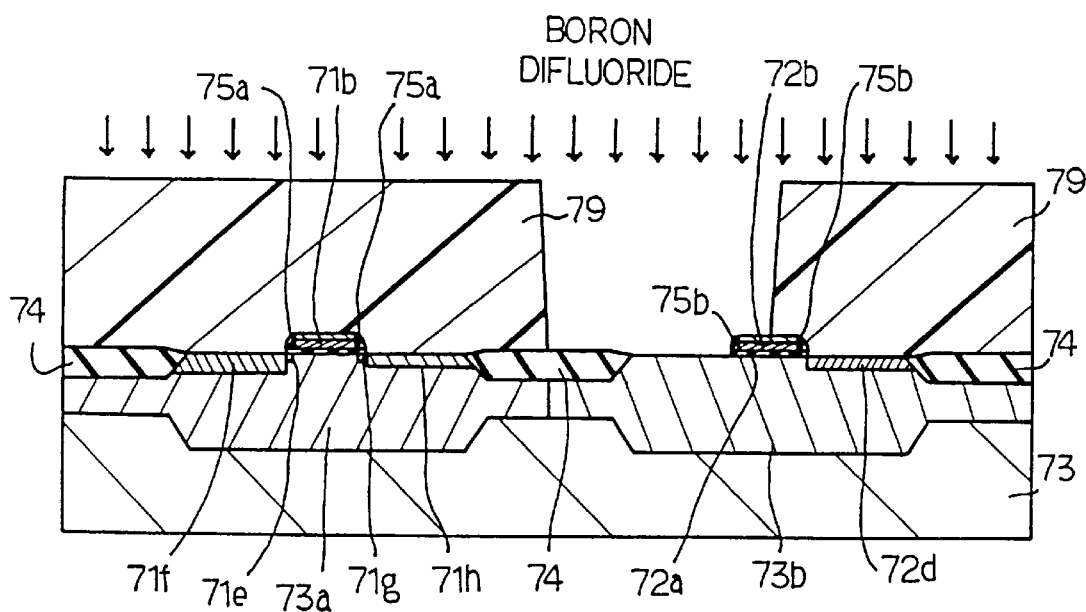

A photo-resist ion-implantation mask 79 is formed over the resultant semiconductor structure, and has an opening over the left half of the n-type well 73b. Boron difluoride is ion implanted into the left half area at dose of $1\times10^{15}$ to $2\times10^{15}$ cm$^{-2}$ under acceleration energy of 110 to 130 KeV as shown in FIG. 6E. The ion-implanted boron difluoride forms the p-type source region 72c as shown in FIG. 5. The photo-resist ion-implantation mask 79 is stripped off.

As will be under stood from the foregoing description, the side wall spacers 75a/75b are formed through the single etching step, and the source/drain regions 71f/71h and 72c/72d are formed through different ion-implantation steps. The acceleration energy is changed, and the source regions 71f/72c become deeper than the drain regions 71h/72d. For this reason, the impurity profile is reproducible, and the transistor characteristics are stable.

Although particular embodiments of the present invention have been shown and described, it will be obvious to those skilled in the art that various changes and modifications may be made without departing from the spirit and scope of the present invention.

For example, the gate electrode may be formed of polysilicon or refractory metal silicide, only.

The source/drain regions of the p-channel type field effect transistor may be formed earlier than the source/drain regions of the n-channel type field effect transistor.

What is claimed is:

1. A process for fabricating a semiconductor device, comprising the steps of:
   a) preparing a semiconductor substrate including at least a first active area for a field effect transistor having a first gate electrode area, a first source/drain area on one side of said first gate electrode area and a second source/drain area on the other side of said first gate electrode area;
   b) forming a first gate insulating layer on said first gate electrode area;
   c) forming a first gate electrode on said first gate insulating layer;
   d) covering one of said first and second source/drain areas, that is to have a first shallow source/drain region, with a first spacer layer that absorbs some of a first projection range of a first dopant impurity ion implantation, and leaving the other of said first and second source/drain areas, that is to have a first deep source/drain region, uncovered by said first spacer layer; and
   e) ion implanting a first dopant impurity into said first and second source/drain areas, so as to concurrently form said first shallow source/drain region of a first conductivity type in said one of said first and second source/drain areas covered by said first spacer layer and said first deep source/drain region of said first conductivity type in said other of said first and second source/drain areas not covered by said first spacer layer, wherein said first shallow source/drain region is formed shallower than said first deep source/drain region.

2. The process for fabricating a semiconductor device as set forth in claim 1, in which said step d) includes the sub-steps of:
   d-1) depositing an insulating material over the entire surface of the resultant semiconductor structure at step c) so as to cover said first and second source/drain areas, and side surfaces and an upper surface of said first gate electrode with an insulating layer;
   d-2) forming an etching mask on said insulating layer having an opening over one of said first and second source/drain areas that is to have said first deep source/drain region and that is to be uncovered by said first spacer layer; and
   d-3) etching said insulating layer until said insulating layer is formed into a side wall spacer formed on one of said side surfaces of said first gate electrode, thereby leaving said first spacer layer under said etching mask.

3. The process for fabricating a semiconductor device, as set forth in claim 2, in which said step d) further includes the sub-step of ion implanting a second dopant impurity into said first and second source/drain areas in a self-aligned manner with said first gate electrode so as to form a first lightly doped source/drain region of said first conductivity type shallower than said first shallow source/drain region and a second lightly doped source/drain region of said first conductivity type shallower than said first deep source/drain region in said first and second source/drain areas between said step c) and said step d-1), said first shallow source/drain region and said first deep source/drain region being partially overlapped with said first and second lightly-doped source/drain regions.

4. The process for fabricating a semiconductor device, as set forth in claim 3, in which said first dopant impurity and said second dopant impurity impart n-conductivity type to said first shallow source/drain region, said first deep source/drain region, and said first and second lightly-doped source/drain regions.

5. The process for fabricating a semiconductor device, as set forth in claim 1, in which a second gate insulating layer and a second gate electrode are formed over a second gate electrode area of a second active area electrically isolated from said first active area in said steps b) and c), wherein a third source/drain area is located on one side of said second gate electrode area, and a fourth source/drain area is located on the other side of said second gate electrode area, and wherein in said step d), a second spacer layer that absorbs some of a second projection range of a second dopant impurity ion implantation, covers one of said third and fourth source/drain areas that is to have a second shallow source/drain region, leaving the other of said third and fourth source/drain areas, that is to have a second deep source/drain region, uncovered by said second spacer layer, wherein said process for fabricating a semiconductor device, further comprises the step of:

f) ion implanting a second dopant impurity into said third and fourth source/drain areas so as to concurrently form said second shallow source/drain region of a second conductivity type opposite to said first conductivity type in said one of said third and fourth source/drain areas covered by said second spacer layer and said second deep source/drain region of said second conductivity type in said other of said third and fourth source/drain areas not covered by said second spacer layer, wherein said second shallow source/drain region is formed shallower than said second deep source/drain region.

6. The process for fabricating a semiconductor device, as set forth in claim 5, in which said step d) includes the sub-steps of:

d-1) depositing an insulating material over the entire surface of the resultant semiconductor structure at step c) so as to cover said first and second source/drain areas, and side surfaces and an upper surface of said first gate electrode with an insulating layer;

d-2) forming an etching mask on said insulating layer having an opening over one of said first and second source/drain areas that is to have said first deep source/drain region and that is to be uncovered by said first spacer layer; and d-3) etching said insulating layer until said insulating layer is formed into a side wall spacer formed on one of said side surfaces of said first gate electrode, thereby leaving said first spacer layer under said etching mask.

7. The process for fabricating a semiconductor device, as set forth in claim 6, in which said step d) further includes the sub-step of ion implanting a third dopant impurity into said first and second source/drain areas in a self-aligned manner with said first gate electrode so as to form a first lightly doped source/drain region of said first conductivity type shallower than said first shallow source/drain region and a second lightly doped source/drain region of said first conductivity type shallower than said first deep source/drain region in said first and second source/drain areas between said step c) and said step d-1), said first shallow source/drain region and said first deep source/drain region being partially overlapped with said first and second lightly-doped source/drain regions.

8. The process for fabricating a semiconductor device, as set forth in claim 7, in which said first dopant impurity and said third dopant impurity impart n-conductivity type to said first shallow source/drain region, said first deep source/drain region, said first and second lightly-doped source/drain regions.

9. A process for fabricating a semiconductor device comprising the steps of:

a) preparing a semiconductor substrate including at least a first active area for a field effect transistor having a first gate electrode area, a first source/drain area on one side of said first gate electrode area and a second source/drain area on the other side of said first gate electrode area;

b) forming a gate insulating layer on said first gate electrode area;

c) forming a gate electrode on said first gate insulating layer;

d) ion implanting a dopant impurity under a first acceleration energy, into only one of said first and second source/drain areas, so as to form a drain region having a drain bottom p-n junction defining a deepest drain edge between said drain region and a substrate; and e) ion implanting said dopant impurity under a second acceleration energy, into only the other of said first and second source/drain areas, so as to form a source region having a source bottom p-n junction defining a deepest source edge between said source region and said substrate;

wherein said first acceleration energy is different from said second acceleration energy, wherein said deepest drain edge is formed at a different depth than said deepest source edge.

10. The process for fabricating a semiconductor device as set forth in claim 9, wherein:

said step d) includes the sub-steps of:

d-1) ion implanting a first dopant impurity under a third acceleration energy into said first and second source/drain areas in a self-aligned manner with said gate electrode for forming a first lightly-doped source/drain region and a second lightly-doped source/drain region in said first and second source/drain areas;

d-2) forming side wall spacers on both side surfaces of said gate electrodes d-3) forming a first ion-implantation mask covering one of said first and second source/drain areas, and having a first opening over the other of said first and second source/drain areas;

d-4) ion implanting a second dopant impurity into said other of said first and second source/drain areas under said first acceleration energy in a self-aligned manner with one of said side wall spacers so as to form one of said source and drain regions, wherein said first acceleration energy is greater than said third acceleration energy, wherein said one of said source and drain regions is heavily-doped, wherein one of said first and second lightly-doped source/drain regions and said one of said source and drain regions in combination form a first LDD source/drain region; and d-5) removing said first ion-implantation mask; and said step e) includes the sub-steps of:

e-1) forming a second ion-implantation mask covering said other of said first and second source/drain areas, and having a second opening over said one of said first and second source/drain areas;

e-2) ion implanting a third dopant impurity into said one of said first and second source/drain areas under said second acceleration energy in a self-aligned manner with the other of said side wall spacers so as to form the other of said source and drain regions, wherein said second acceleration energy is greater than said third acceleration energy, wherein said other of said source and drain regions is heavily-doped, wherein the other of said first and second lightly-doped source/drain regions and said other of said source and drain regions in combination form a second LDD source/drain region; and e-3) removing said second ion-implantation mask.

11. The process for fabricating a semiconductor device as set forth in claim 1, further comprising the step of forming side wall spacers adjacent to a drain side and a source side of said first gate electrode, wherein each of said side wall spacers are substantially formed during a single etching step.

12. The process for fabricating a semiconductor device as set forth in claim 9, further comprising the step of forming side wall spacers adjacent to a drain side and a source side of said gate electrode, wherein each of said side wall spacers are substantially formed during a single etching step.

13. A process for fabricating a semiconductor device, comprising the steps of:
   a) preparing a semiconductor substrate including at least a first active area for a field effect transistor having a first gate electrode area, a first source/drain area on one side of said first gate electrode area and a second source/drain area on the other side of said first gate electrode area;
   b) forming a gate insulating layer on said first gate electrode area;
   c) forming a gate electrode on said first gate insulating layer;
   d) ion implanting a dopant impurity under a first acceleration energy into one of said first and second source/drain areas, so as to form a drain region having a drain bottom p-n junction defining a deepest drain edge between said drain region and a substrate; and
   e) ion implanting said dopant impurity under a second acceleration energy, into the other of said first and second source/drain areas, so as to form a source region having a source bottom p-n junction defining a deepest source edge between said source region and said substrate;
   wherein said first acceleration energy is lower than said second acceleration energy, and wherein said deepest source edge is formed deeper than said deepest drain edge.

\* \* \* \* \*

UNITED STATES PATENT AND TRADEMARK OFFICE
CERTIFICATE OF CORRECTION

PATENT NO. : 6,022,780
DATED : February 8, 2000
INVENTOR(S) : Hiroaki Yokoyama

It is certified that error appears in the above-indentified patent and that said Letters Patent is hereby corrected as shown below:

Column 2, line 21 delete "suicide", insert --silicide--;

line 28 delete "11", insert --10--

Column 5, line 32 delete "suicide", insert --silicide--

Column 10, line 51 delete "suicide", insert--silicide--

Signed and Sealed this

Twentieth Day of March, 2001

Attest:

NICHOLAS P. GODICI

*Attesting Officer*     *Acting Director of the United States Patent and Trademark Office*